United States Patent
Nozaki et al.

(10) Patent No.: US 10,431,303 B2
(45) Date of Patent: Oct. 1, 2019

(54) RESISTANCE CHANGE TYPE MEMORY INCLUDING WRITE CONTROL CIRCUIT TO CONTROL WRITE TO VARIABLE RESISTANCE ELEMENT

(71) Applicant: National Institute of Advanced Industrial Science and Technology, Chiyoda-ku, Tokyo (JP)

(72) Inventors: Takayuki Nozaki, Tsukuba (JP); Yoshishige Suzuki, Tsukuba (JP); Shinji Yuasa, Tsukuba (JP); Yoichi Shiota, Tsukuba (JP); Takurou Ikeura, Tsukuba (JP); Hiroki Noguchi, Hsinchu (TW); Kazutaka Ikegami, Inagi (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 15/827,626

(22) Filed: Nov. 30, 2017

(65) Prior Publication Data

US 2018/0158525 A1    Jun. 7, 2018

(30) Foreign Application Priority Data

Dec. 2, 2016  (JP) .................................. 2016-235441

(51) Int. Cl.
  *G11C 13/00*  (2006.01)
  *G11C 11/16*  (2006.01)
(52) U.S. Cl.
  CPC ...... *G11C 13/0069* (2013.01); *G11C 11/1655* (2013.01); *G11C 11/1675* (2013.01);
  (Continued)

(58) Field of Classification Search
  CPC ............ G11C 13/0069; G11C 11/1655; G11C 11/1697; G11C 11/1693; G11C 11/1677;
  (Continued)

(56) References Cited

U.S. PATENT DOCUMENTS 9,911,481 B1 *    3/2018 Alam .................. G11C 11/1655
2012/0069633 A1 *  3/2012 Katoh .................. G11C 13/004
                                         365/148

(Continued)

FOREIGN PATENT DOCUMENTS

WO   WO 2015/141033 A1    9/2015

OTHER PUBLICATIONS

Shiota, Y. et al, "Evaluation of write error rate for voltage-driven dynamic magnetization switching in magnetic tunnel junctions with perpendicular magnetization", Applied Physics Express 9, 013001 (2016), The Japan Society of Applied Physics.

*Primary Examiner* — Pho M Luu
*Assistant Examiner* — Jerome Leboeuf
(74) *Attorney, Agent, or Firm* — John P. White; Cooper & Dunham LLP

(57) ABSTRACT

A resistance change type memory includes a variable resistance element connected between first and second bit lines and a write control circuit including first and second transistors each including a terminal connected to the first bit line. The write control circuit controls write to the variable resistance element. The write control circuit supplies a second voltage to the first bit line with a first pulse width via the second transistor in the ON state after supplying a first voltage to the first bit line via the first transistor.

18 Claims, 24 Drawing Sheets

(52) U.S. Cl.
CPC ...... *G11C 11/1677* (2013.01); *G11C 11/1693* (2013.01); *G11C 11/1697* (2013.01); *G11C 13/0026* (2013.01); *G11C 13/0038* (2013.01); *G11C 13/0061* (2013.01); *G11C 13/0064* (2013.01); *G11C 2013/0076* (2013.01); *G11C 2013/0092* (2013.01); *G11C 2213/79* (2013.01)

(58) Field of Classification Search
CPC ............ G11C 13/0026; G11C 13/0061; G11C 11/1675; G11C 13/0064; G11C 13/0038; G11C 2013/0076; G11C 2013/0092; G11C 2213/79
See application file for complete search history.

(56) References Cited

U.S. PATENT DOCUMENTS

| | | | |
|---|---|---|---|
| 2015/0063020 A1* | 3/2015 | Kajigaya | G11C 11/1675 365/158 |
| 2016/0196873 A1 | 7/2016 | Toshiba | |
| 2018/0075895 A1* | 3/2018 | Kishi | G11C 7/1096 |

\* cited by examiner

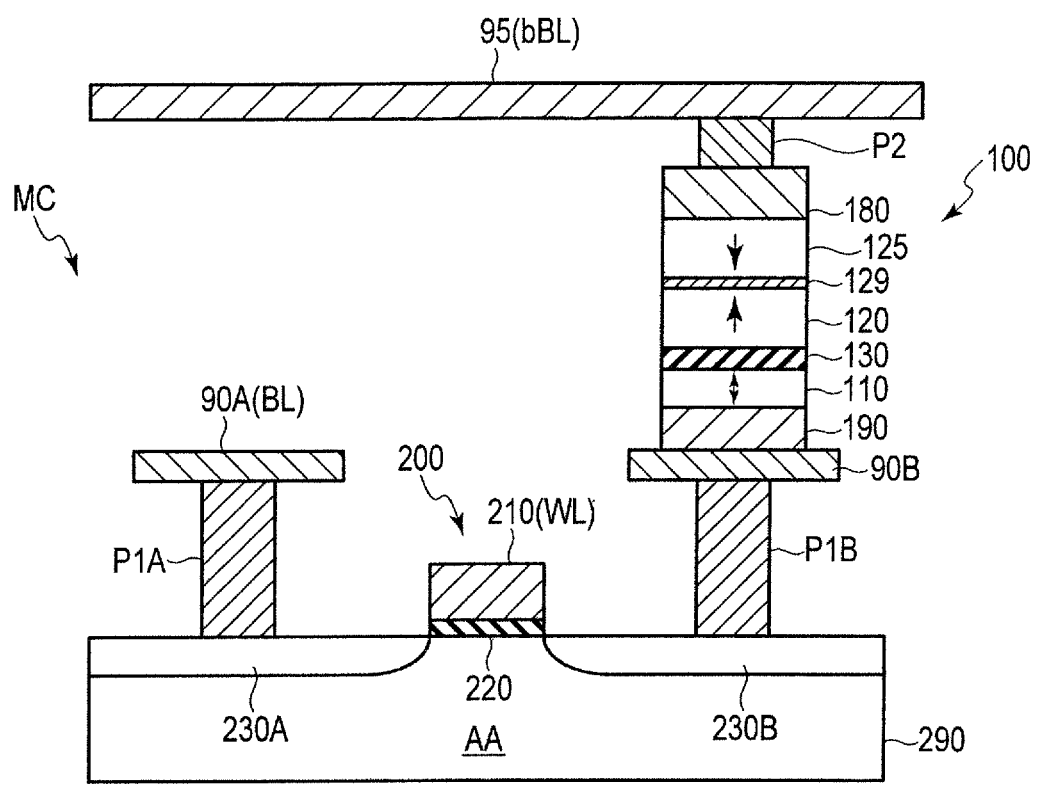
F I G. 2

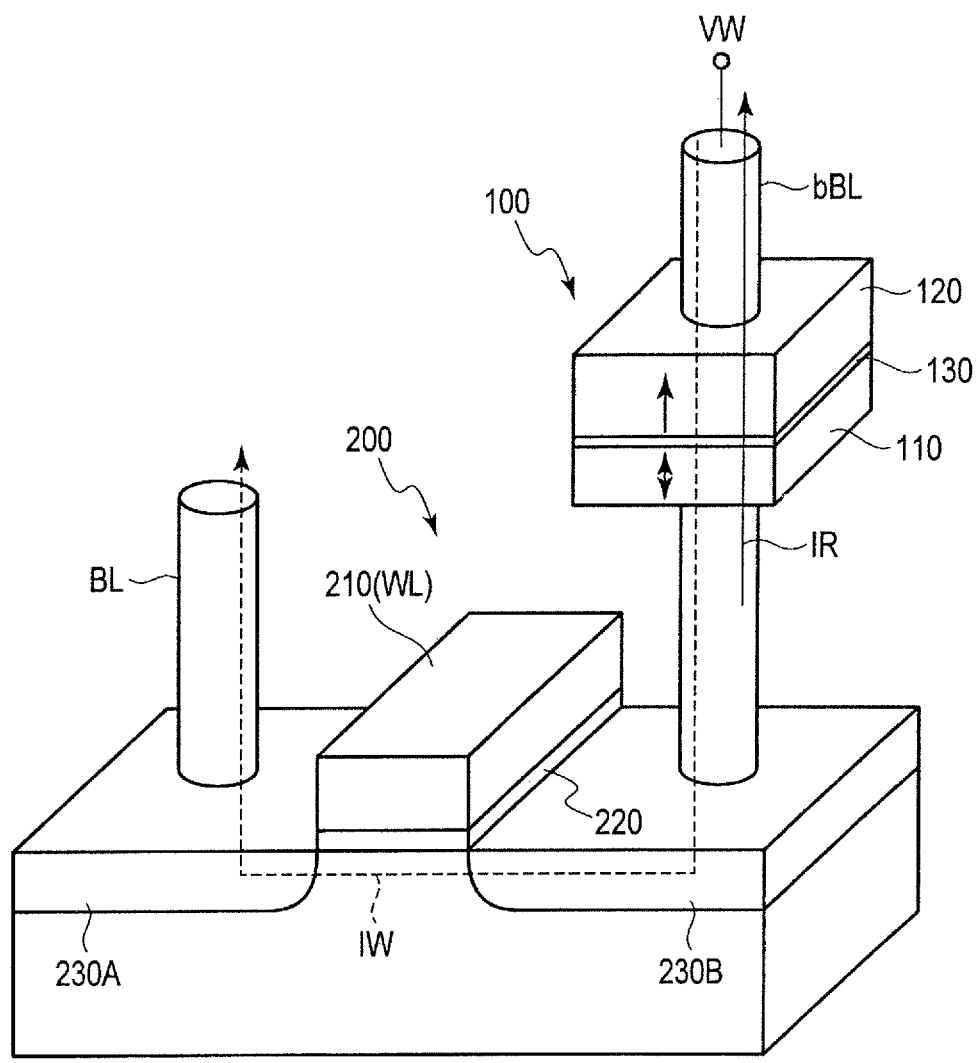
F I G. 3

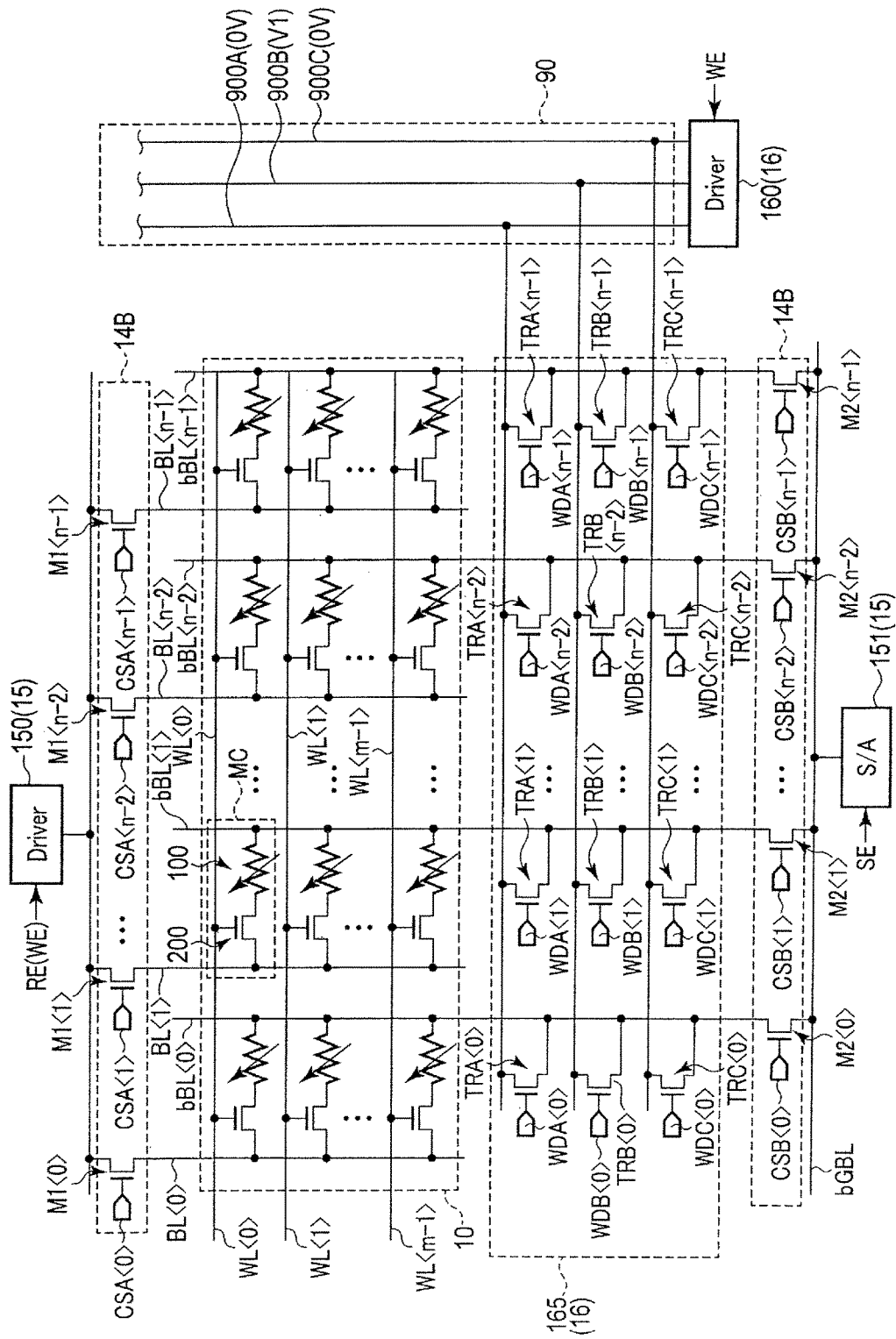
F I G. 6

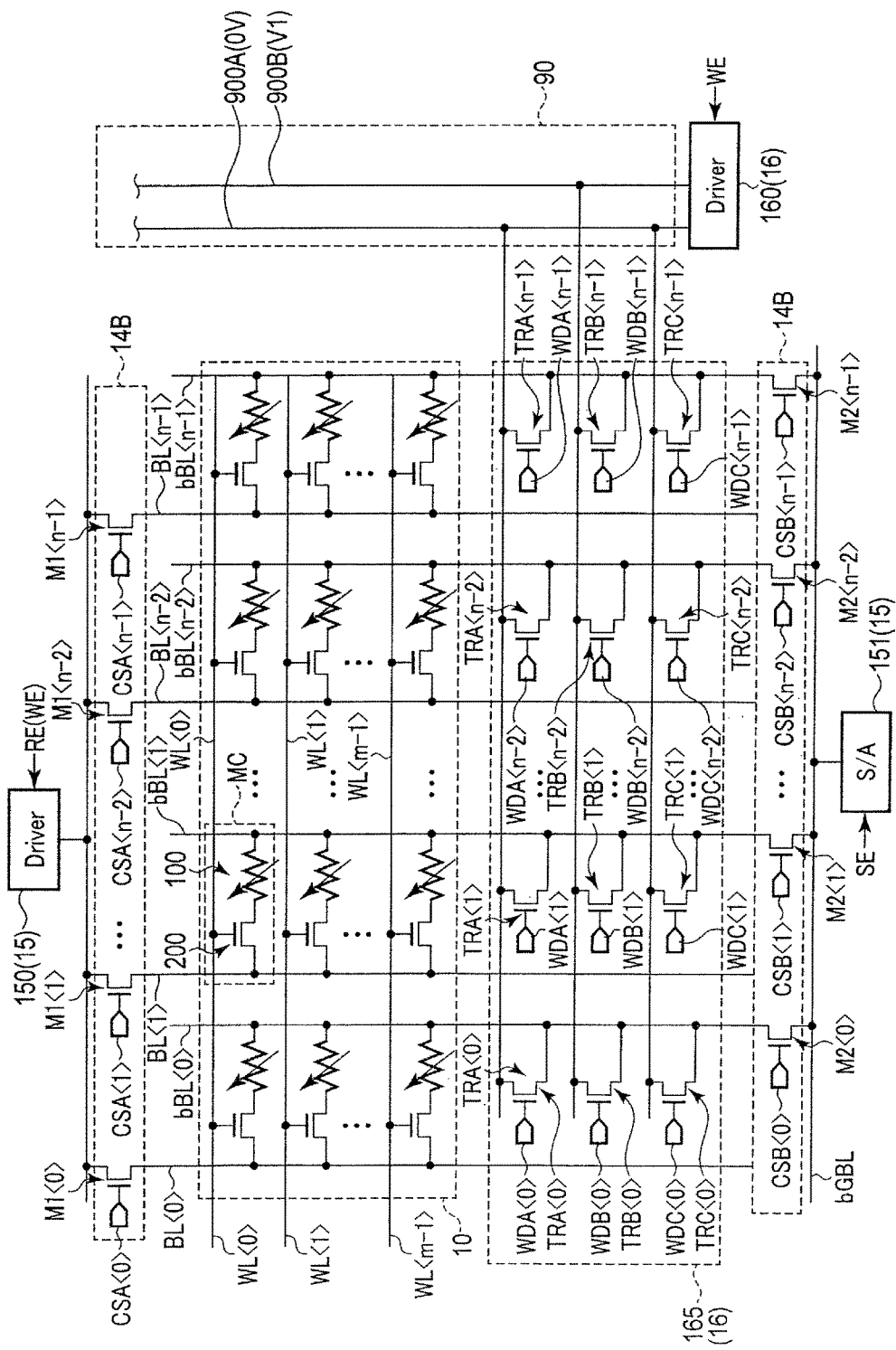
F I G. 8

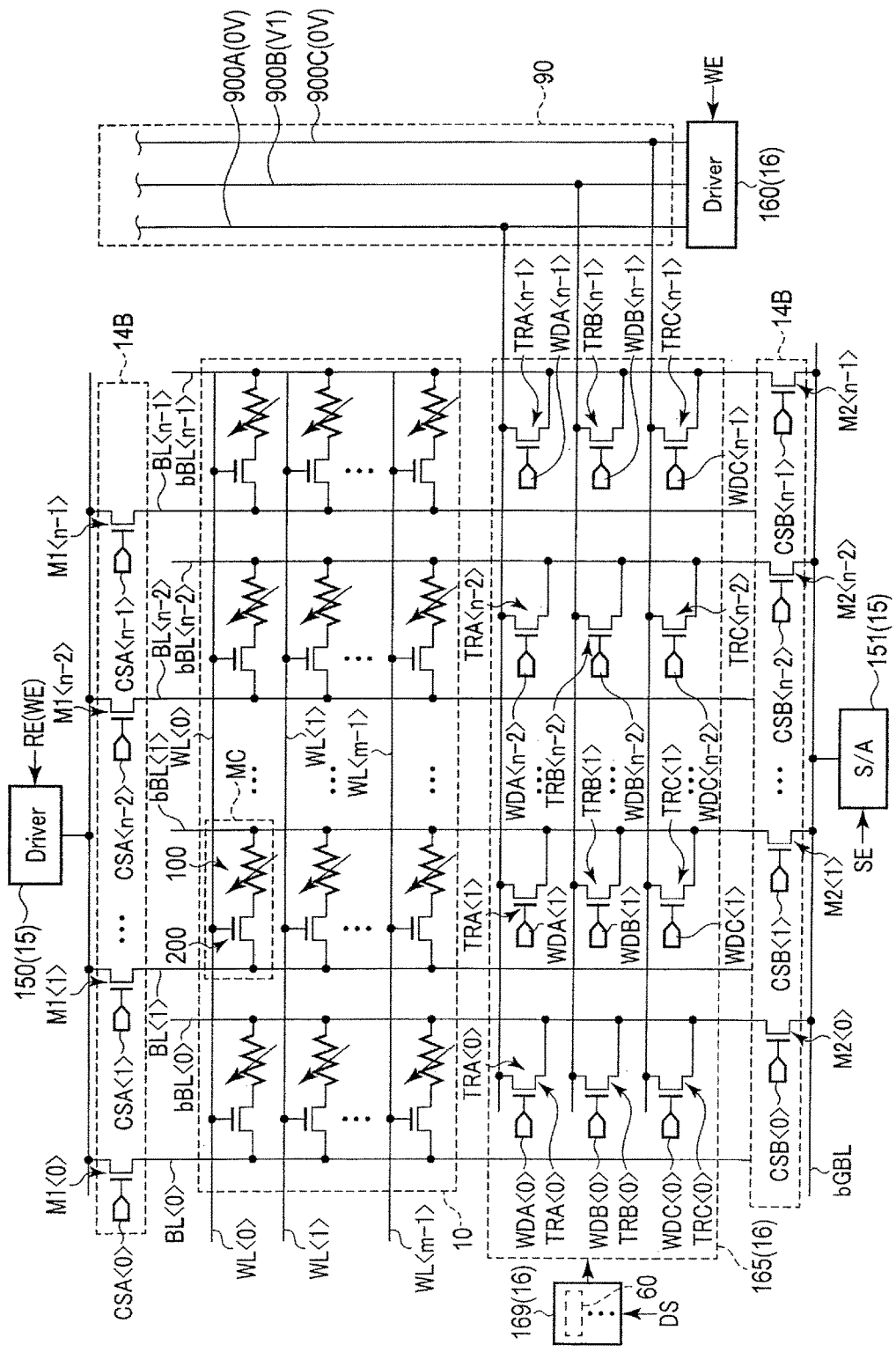
F I G. 9

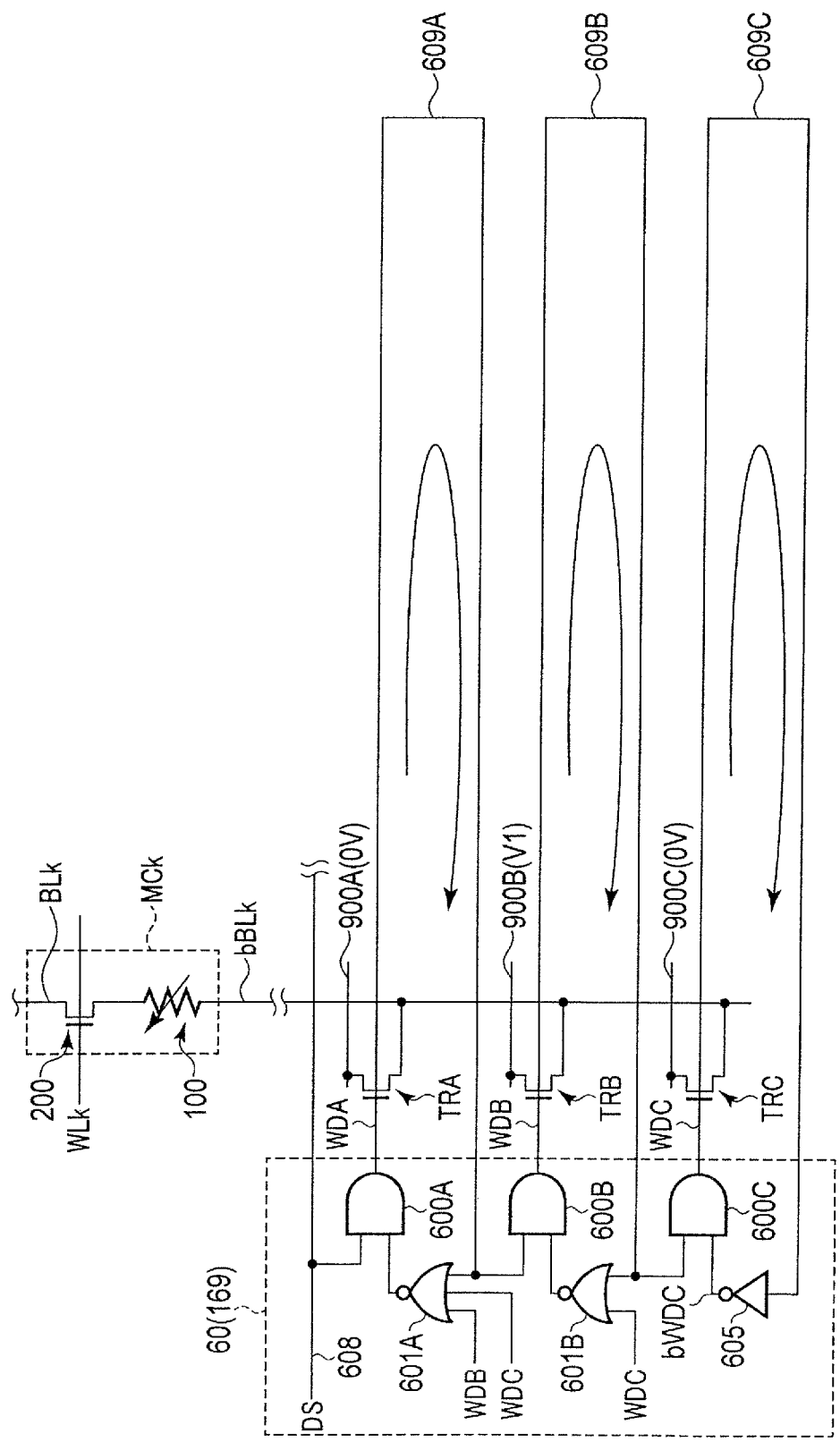
F I G. 10

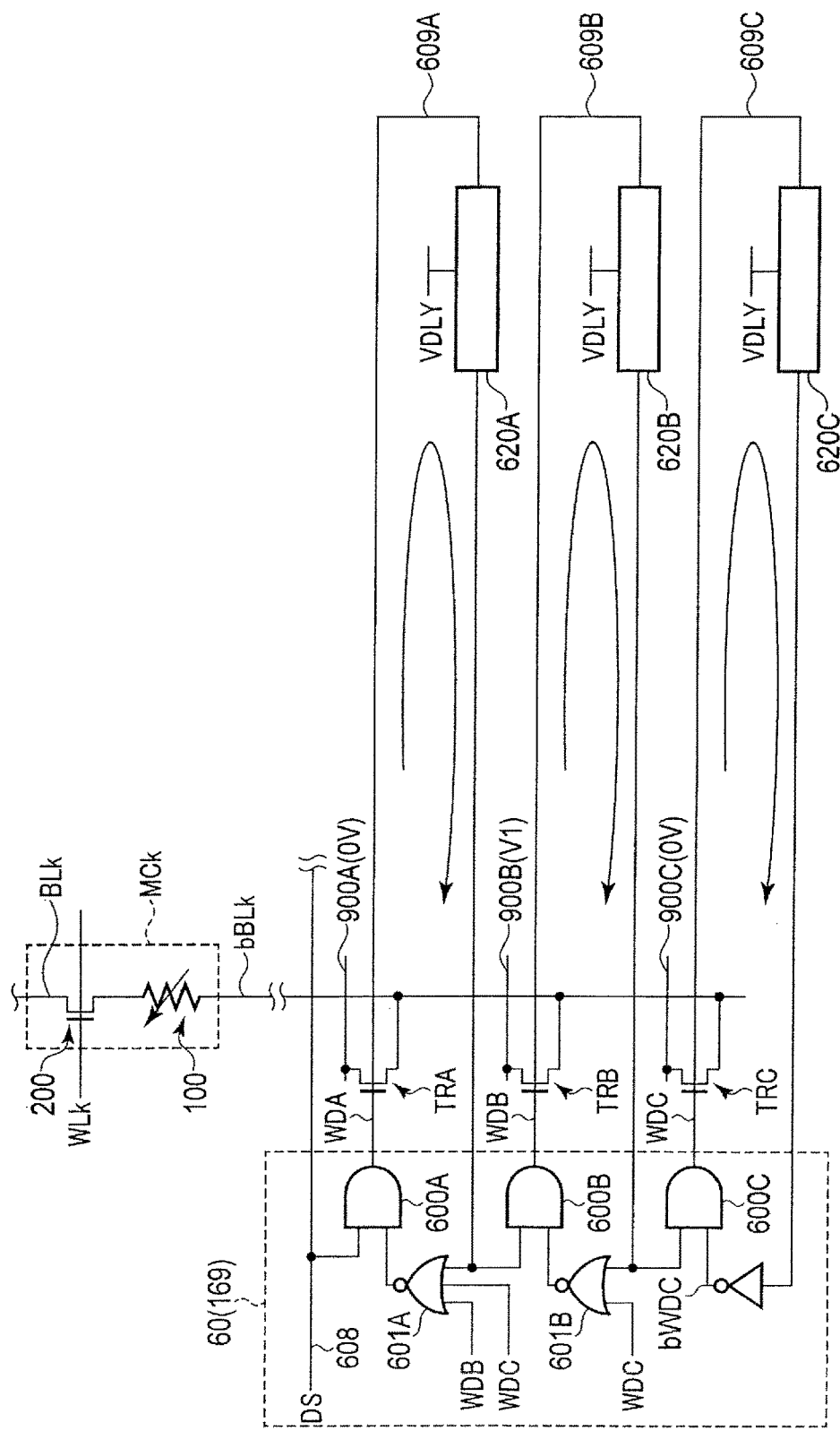
F I G. 11

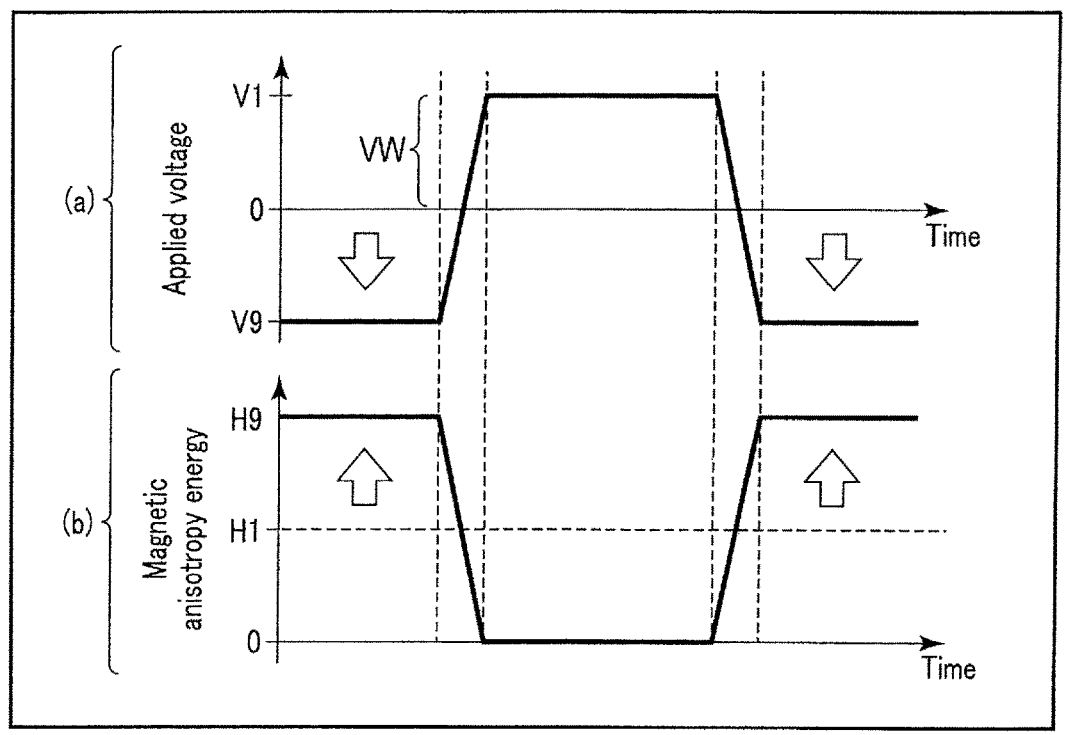
F I G. 12

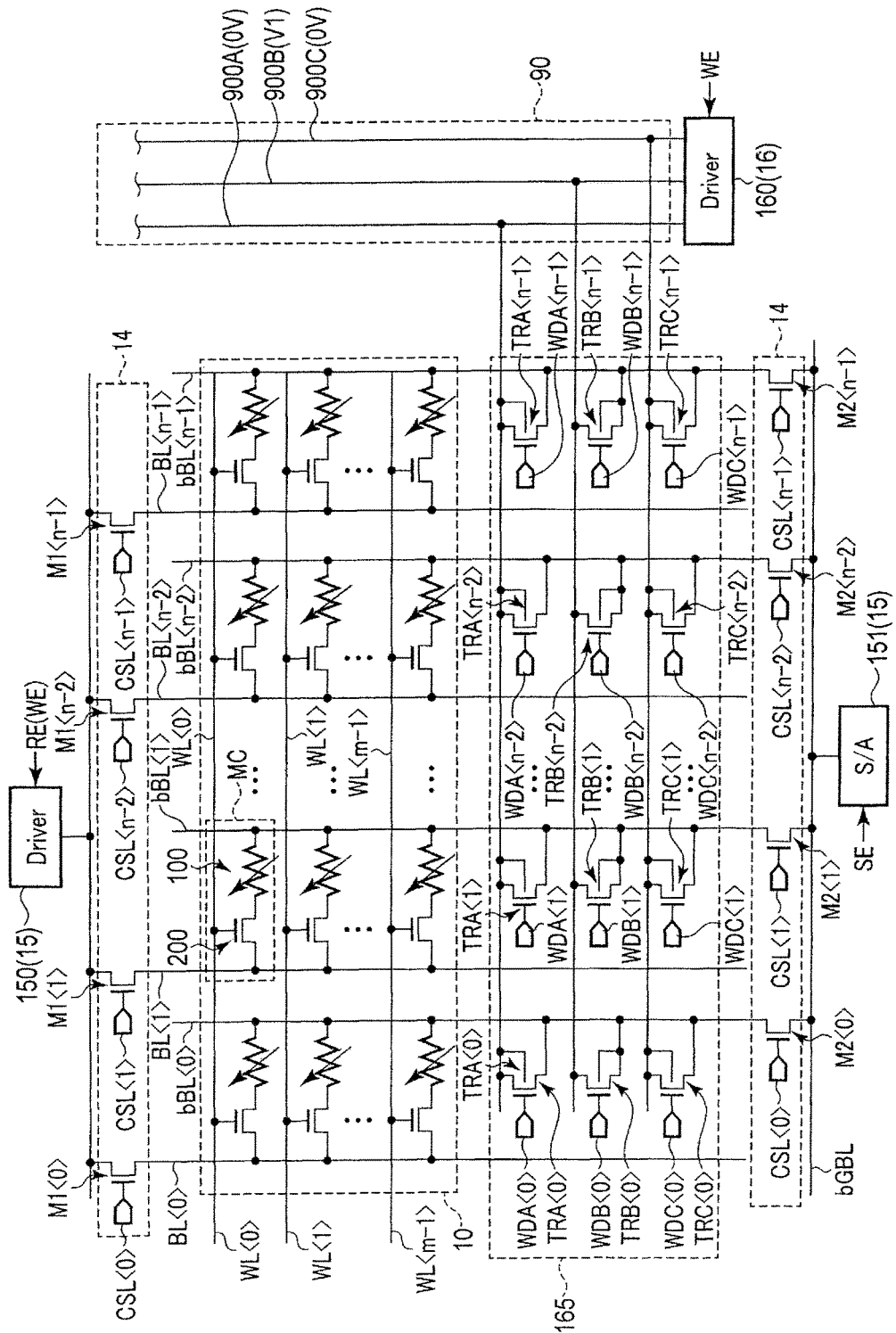
F I G. 18

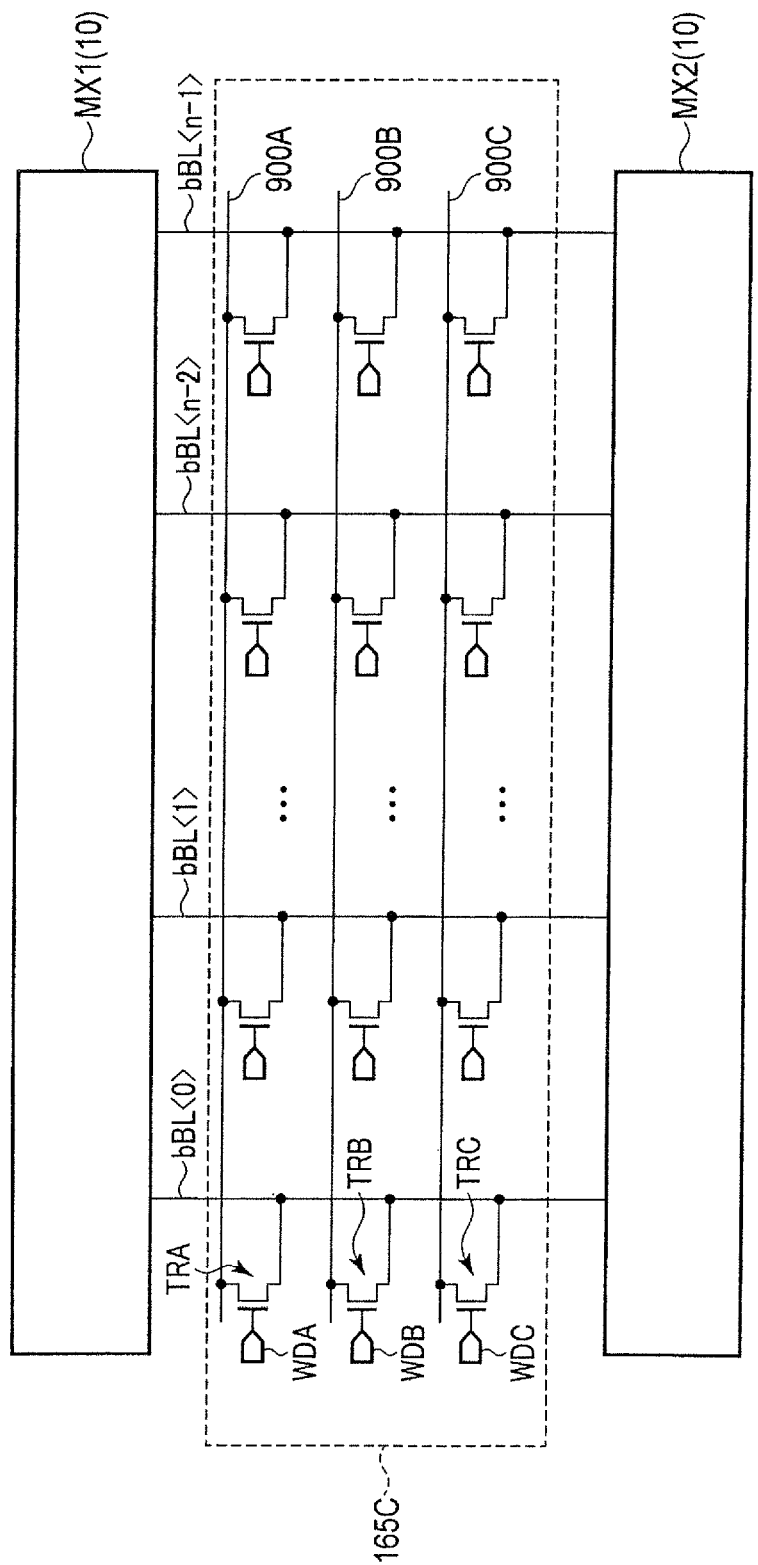
F I G. 20

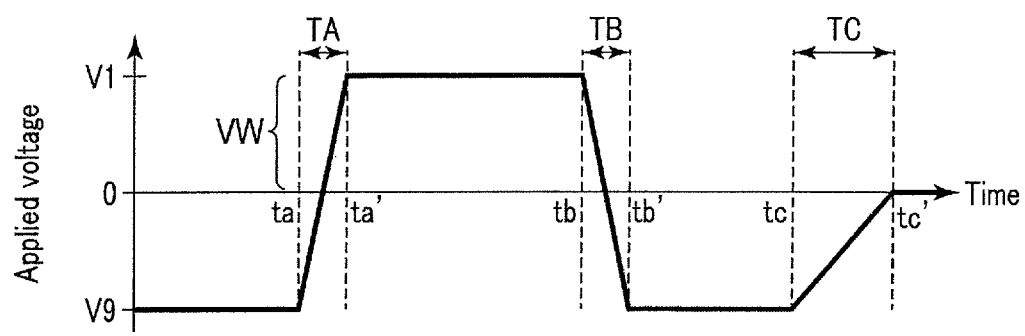
F I G. 21

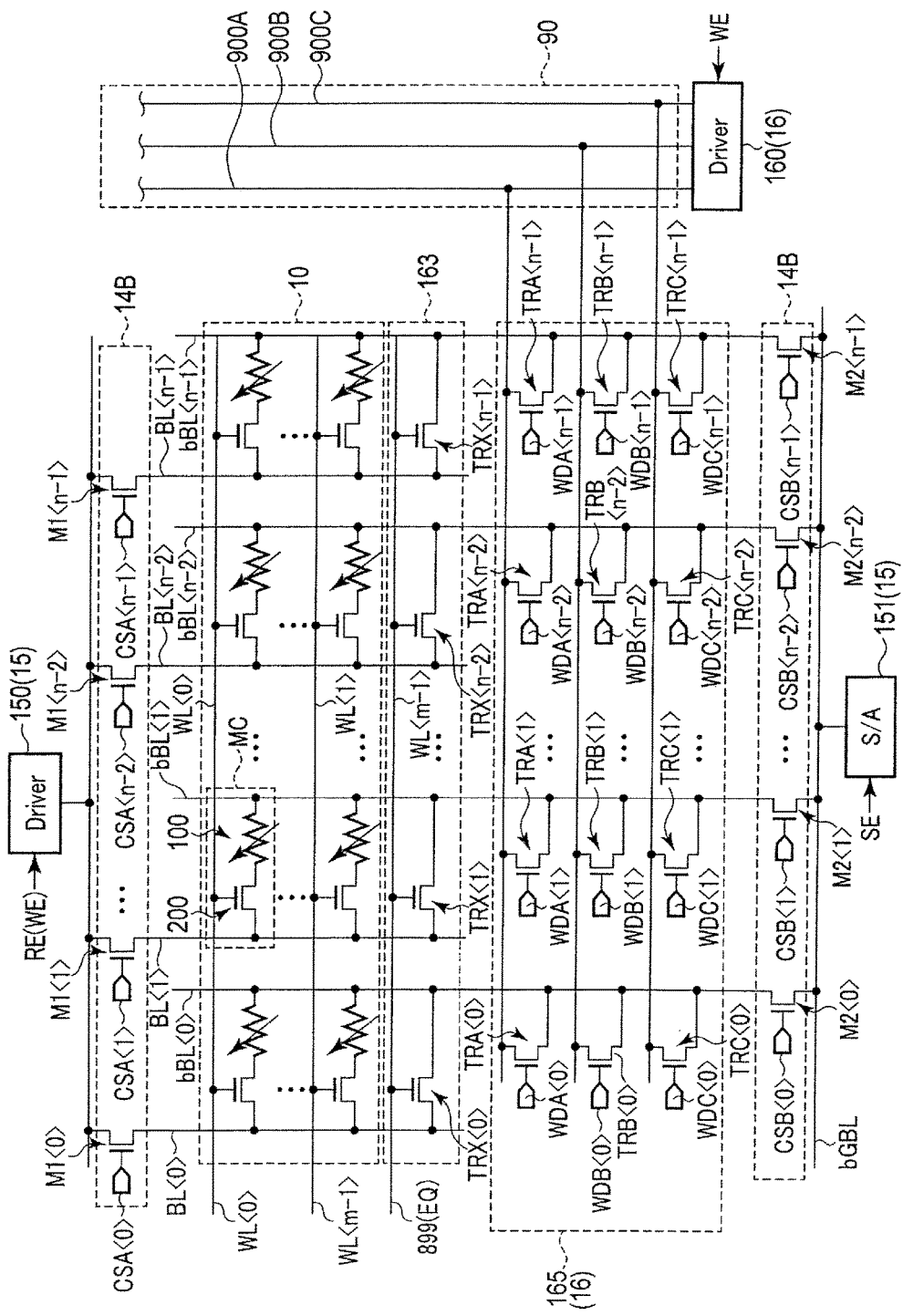
F I G. 22

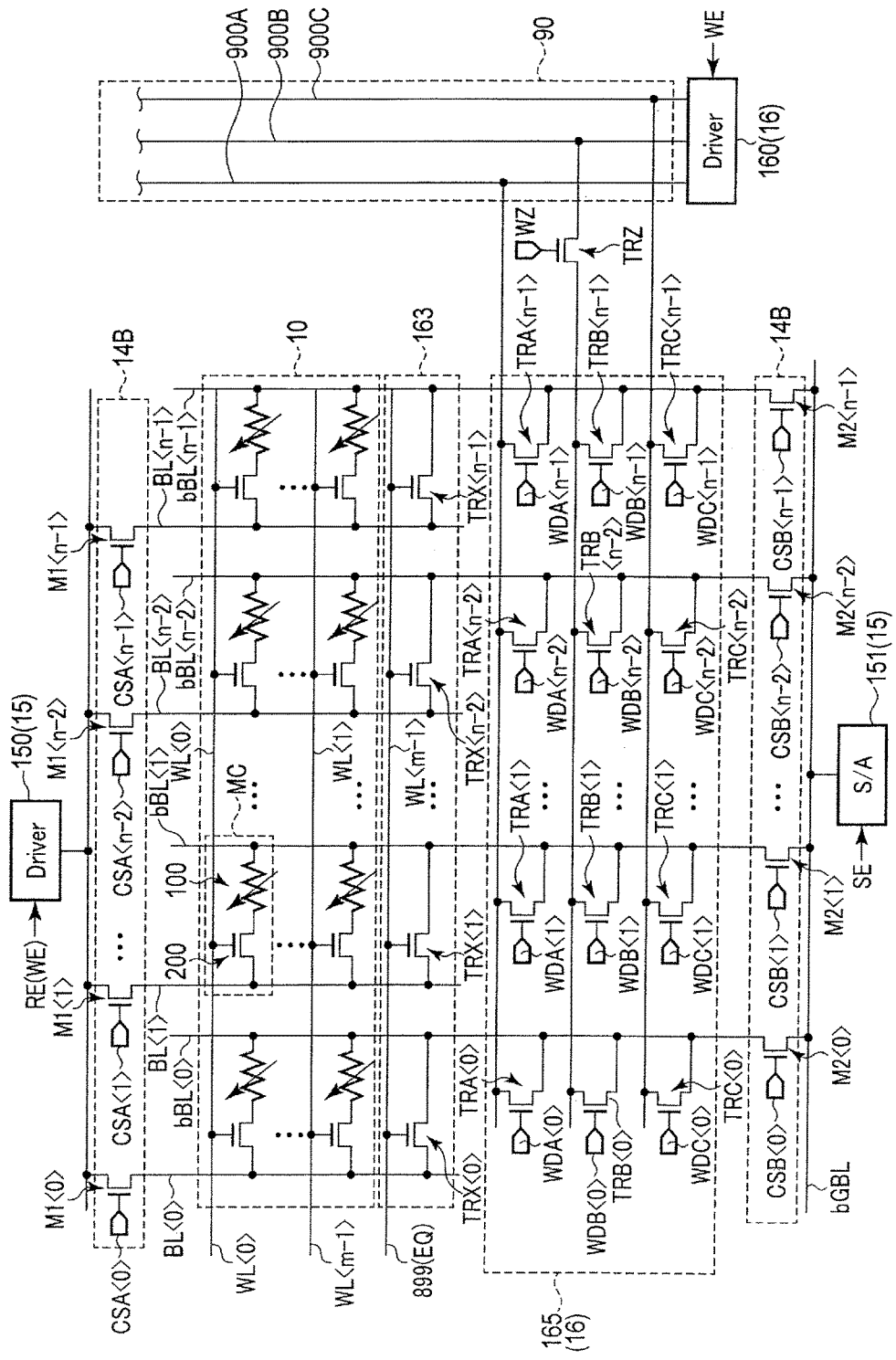
F I G. 24

RESISTANCE CHANGE TYPE MEMORY INCLUDING WRITE CONTROL CIRCUIT TO CONTROL WRITE TO VARIABLE RESISTANCE ELEMENT

CROSS-REFERENCE TO RELATED APPLICATIONS

This application is based upon and claims the benefit of priority from Japanese Patent Application No. 2016-235441, filed Dec. 2, 2016, the entire contents of which are incorporated herein by reference.

FIELD

Embodiments described herein relate generally to a resistance change type memory.

BACKGROUND

Attention has been paid to a resistance change type memory such as an MRAM, as a substitute for volatile memories such as an SRAM and a DRAM.

In order to improve the characteristics and function of the resistance change type memory, the research and development of various operations, such as data write and data read, have been promoted.

SUMMARY

A resistance change type memory according to one embodiment includes: a variable resistance element connected between a first bit line and a second bit line; a write control circuit including a first transistor with a first terminal connected to the first bit line, and a second transistor with a second terminal connected to the first bit line, the write control circuit controlling write to the variable resistance element; a first interconnect supplied with a first voltage and connected to the first bit line via the first transistor; and a second interconnect supplied with a second voltage which is higher than the first voltage, and connected to the first bit line via the second transistor. The write control circuit supplies the first voltage to the first bit line via the first transistor which is in an ON state; sets the second transistor in an ON state after supplying the first voltage; and supplies the second voltage to the first bit line with a first pulse width via the second transistor which is in the ON state.

BRIEF DESCRIPTION OF THE DRAWINGS

FIG. 2 is a schematic cross-sectional view illustrating a configuration example of a memory cell of the resistance change type memory of the embodiment;

FIG. 3 is a view for describing an operational principle of the resistance change type memory of the embodiment;

FIG. 6 is an equivalent circuit diagram illustrating a configuration example of a resistance change type memory of a first embodiment;

FIG. 8 is an equivalent circuit diagram illustrating a configuration example of the resistance change type memory of the first embodiment;

FIG. 9 is an equivalent circuit diagram illustrating a configuration example of a resistance change type memory of a second embodiment;

FIG. 10 is an equivalent circuit diagram illustrating a configuration example of the resistance change type memory of the second embodiment;

FIG. 11 is an equivalent circuit diagram illustrating a configuration example of the resistance change type memory of the second embodiment;

FIG. 12 is a view for describing an operational principle of a resistance change type memory of a third embodiment;

FIG. 18 is an equivalent circuit diagram illustrating a configuration example of a resistance change type memory of a fourth embodiment;

FIG. 20 is a schematic view for describing a configuration example of the resistance change type memory of the fifth embodiment;

FIG. 21 is a schematic view for describing a resistance change type memory of a sixth embodiment;

FIG. 22 is an equivalent circuit diagram illustrating a configuration example of the resistance change type memory of the sixth embodiment;

FIG. 24 is an equivalent circuit diagram illustrating a configuration example of a resistance change type memory of a seventh embodiment.

DETAILED DESCRIPTION

[Embodiments]

Figure 1:
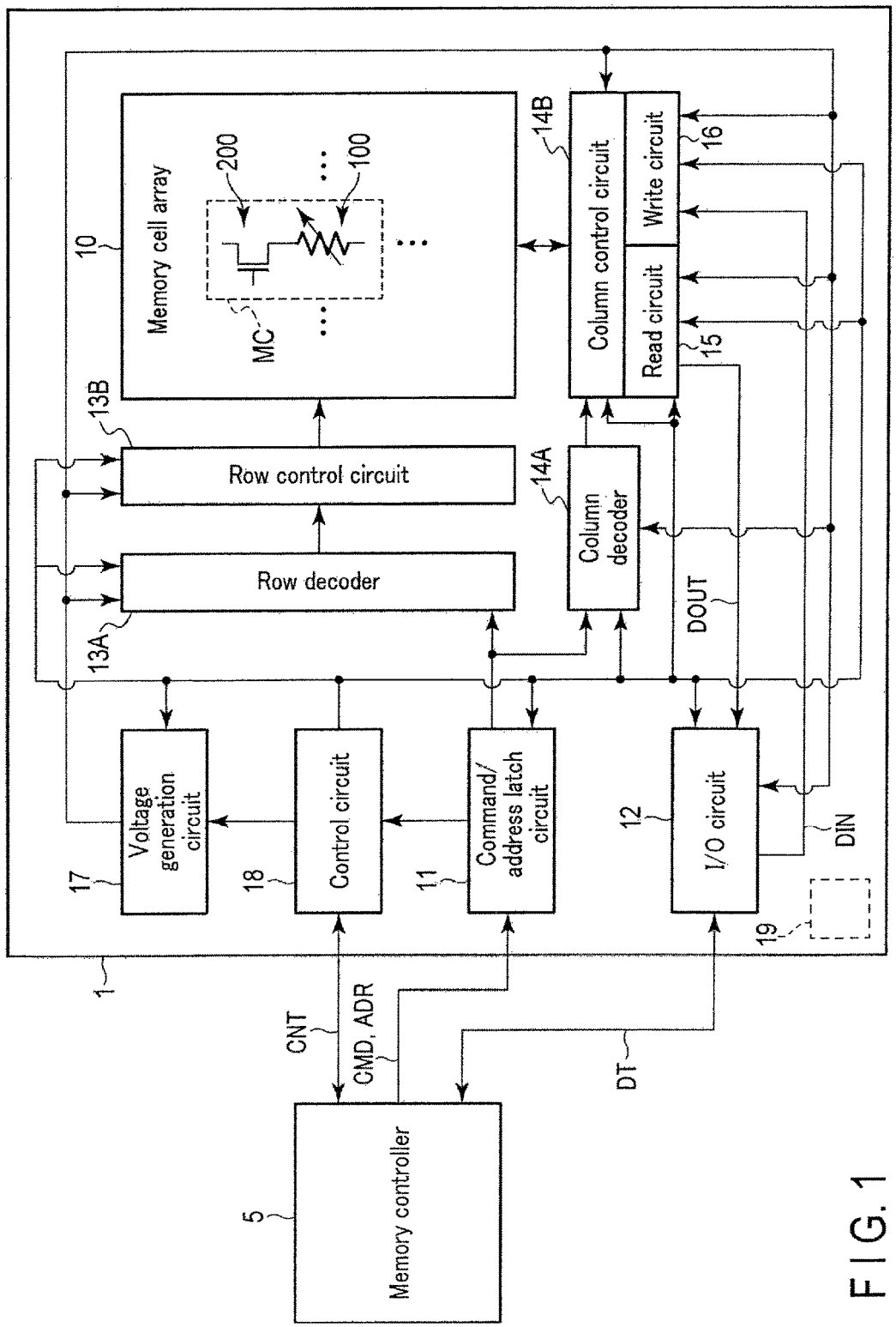
FIG. 1 is a view for describing a configuration example of a resistance change type memory of an embodiment.

Hereinafter, embodiments will be described in detail with reference to FIG. 1 to FIG. 25. In the description below, elements having the same functions and structures are denoted by like reference numerals. In addition, in the embodiments below, when structural elements (e.g. word lines WL, bit lines BL, various voltages and signals) having reference numerals with subscripts of numerals/alphabetic characters for distinction are not distinguished from each other, expressions are used in which such numerals/alphabetic characters are omitted.

(1) First Embodiment

A resistance change type memory of a first embodiment will be described with reference to FIG. 1 to FIG. 8.

(a) Entire Configuration

Referring to FIG. 1 and FIG. 2, a configuration example of the resistance change type memory of the embodiment will be described.

FIG. 1 is a block diagram for describing a configuration example of the resistance change type memory of the first embodiment.

As illustrated in FIG. 1, a resistance change type memory 1 is connected directly or indirectly to a memory controller 5. The resistance change type memory 1 and memory controller 5 are included in a memory system.

The memory controller 5 can control the operation of the resistance change type memory 1. The memory controller 5 includes a CPU, a buffer memory, a work memory, an ECC circuit, etc.

Based on a request from a host device (not shown), the memory controller 5 generates a command by using the CPU. The memory controller 5 sends the generated command to the resistance change type memory 1.

The memory controller 5 sends, based on a management table in the work memory, an address of a memory cell to be selected to the resistance change type memory 1.

At a time of writing data to the resistance change type memory 1, the memory controller 5 adds, by the ECC circuit, parity to the data that is to be written. The memory controller 5 sends the data, to which the parity is added, to the resistance change type memory 1 via the buffer memory.

At a time of reading data from the resistance change type memory 1, the memory controller 5 receives, via the buffer memory, data which is read from the resistance change type memory 1. The memory controller 5 detects an error in the read data by an ECC process which is executed on the read data, and corrects the detected error. The memory controller 5 sends the data, which was subjected to the ECC process, to the host device.

The resistance change type memory 1 includes at least a memory cell array 10, a command/address latch circuit 11, an input/output circuit 12, a row decoder 13A, a row control circuit 13B, a column decoder 14A, a column control circuit 14B, a read circuit 15, a write circuit 16, a voltage generation circuit 17 and a control circuit 18.

The memory cell array 10 includes a plurality of memory cells MC. In the resistance change type memory, the memory cell MC includes at least one variable resistance element 100 and at least one cell transistor 200.

The variable resistance element 100 functions as a memory element. In the resistance change type memory 1, a plurality of resistance values (resistance states) which the variable resistance element 100 can take, and the data to be stored are associated. Thereby, in the resistance change type memory 1, each memory cell MC (each variable resistance element 100) stores data of one or more bits. The cell transistor 200 functions as a select element of the memory cell MC.

The command/address latch circuit 11 temporarily stores a command CMD and an address ADR which are sent from the memory controller 5. The command/address latch circuit 11 sends the command CMD to the control circuit 18. The command/address latch circuit 11 sends the address ADR to the row decoder 13A and column decoder 14A.

The input/output circuit (I/O circuit) 12 temporarily stores data (write data) DIN which is sent from the memory controller 5. The input/output circuit 12 temporarily stores data DOUT which is read from the memory cell array 10. Incidentally, the data DIN and DOUT may be temporarily stored in a page buffer (not shown) in the resistance change type memory 1.

The row decoder 13A decodes a row address included in the address ADR.

Based on the decoded result of the row address, the row control circuit 13B selects a row (e.g. word line) of the memory cell array 10.

The column decoder 14A decodes a column address included in the address ADR.

Based on the decoded result of the column address, the column control circuit 14B selects a column (e.g. bit line) of the memory cell array 10.

The read circuit (read control circuit) 15 executes various controls for a read operation. At a time of the read operation, the read circuit 15 supplies various voltages or currents for data read to the memory cell that is selected based on the address ADR. Thereby, the data stored in the memory cell is read. The read circuit 15 includes at least a read driver and a sense amplifier circuit.

The write circuit (write control circuit) 16 executes various controls for a write operation. At a time of the write operation, the write circuit 16 supplies various voltages or currents for data write to the memory cell that is selected based on the address ADR. Thereby, the data to be written is written to the memory cell MC.

The voltage generation circuit 17 generates various voltages which are used in the operation of the resistance change type memory 1, by using a voltage supplied from the outside of the resistance change type memory 1. The voltage generation circuit 17 supplies the generated voltages to the respective circuits 11 to 16.

The control circuit 18 receives a control signal CNT from the memory controller 5. The control circuit 18 sends the control signal CNT to the memory controller 5 in accordance with the operation state in the resistance change type memory 1. The control circuit 18 receives the command CMD from the memory controller 5 via the command/address latch circuit 11. Based on the command CMD and control signal CNT, the control circuit 18 controls the operations of the circuits 11 to 17 in the resistance change type memory 1.

The control circuit 18 stores, as setup information, information relating to the voltages and currents for use in the write operation and read operation. For example, the control circuit 18 stores information of the voltage values and pulse widths of voltages for use in the write operation.

For example, a test circuit 19 is provided in the chip of the resistance change type memory 1. The test circuit 19 can detect a delay amount of interconnects, etc., as well as detecting defects of the elements and circuits in the memory 1. The test circuit 19 is, for example, a BIST (Built-in self test) circuit.

An ECC circuit may be provided in the chip of the resistance change type memory 1.

Besides, the configuration of the memory system including the resistance change type memory 1 is not limited to the example illustrated in FIG. 1. The resistance change type memory 1 of this embodiment is applicable to various memory systems. For example, there is a case in which the memory controller 5 is not provided for the resistance change type memory 1. In this case, the transmission and reception of commands and data are directly executed between the host device (e.g. processor) and the resistance change type memory 1.

The resistance change type memory 1 may be provided in the memory controller 5 or host device. In addition, there is a case in which the resistance change type memory 1 is used as a work memory, a buffer memory or a cache memory in the memory controller 5 or host device. For example, a device provided on the outside of the resistance change type memory, such as the memory controller 5 or host device, is called "external device".

For example, the resistance change type memory 1 may be provided as an independent single package device. However, there is also a case in which the chip of the resistance change type memory 1 and the chip of the memory controller 5 are sealed in a single package material, and the resistance change type memory 1 and memory controller 5 are provided as a single package device.

For example, the resistance change type memory 1 of the present embodiment is an MRAM. In the MRAM, a magnetoresistive effect element is used for the variable resistance element 100 functioning as the memory element.

The memory cell MC including the magnetoresistive effect element 100 has the following configuration.

<Configuration Example of Memory Cell>

FIG. 2 is a cross-sectional view illustrating a configuration example of a memory cell of the MRAM of the present embodiment.

As illustrated in FIG. 2, the memory cell MC is provided on a semiconductor substrate 290. Incidentally, in FIG. 2, for the purpose of simple illustration, depiction of an interlayer insulation film on the semiconductor substrate 290 and device isolation insulation films in the semiconductor substrate 290 is omitted.

The cell transistor 200 is a transistor of an arbitrary type. For example, the cell transistor 200 is a field-effect transistor of a planar structure, a field-effect transistor of a three-dimensional structure such as a FinFET, or a field-effect transistor having a buried gate structure. In the description below, the cell transistor having the planar structure is illustrated by way of example.

The cell transistor 200 is provided in an active region (semiconductor region) AA on the semiconductor substrate 290.

In the cell transistor 200, a gate electrode 210 is provided above the active region AA via a gate insulation film 220. Source/drain regions 230A and 230B of the cell transistor 200 are provided in the active region AA.

The gate electrode 210 extends in a depth direction in the Figure (or toward a viewer side of the Figure). The gate electrode 210 functions as a word line WL.

A contact plug P1A is provided on the source/drain region 230A. An interconnect (metal film) 90A functioning as a bit line BL is provided on the contact plug P1A.

A contact plug P1B is provided on the source/drain region 230B.

The magnetoresistive effect element 100 is provided on a metal film 90B on the contact plug P1B. The magnetoresistive effect element 100 is provided in an interlayer insulation film (not shown) above the semiconductor substrate 290.

The magnetoresistive effect element 100 includes, at least, two magnetic layers 110 and 120, a nonmagnetic layer 130, an upper electrode 180 and a lower electrode 190.

The nonmagnetic layer 130 is provided between the two magnetic layers 110 and 120. One magnetic layer 110 is provided between the lower electrode 190 and nonmagnetic layer 130. The other magnetic layer 120 is provided between the nonmagnetic layer 130 and upper electrode 180. The lower electrode 190 is provided on the metal film 90B. An interconnect (metal film) 95 functioning as a bit line bBL is provided above the upper electrode 180. A via plug P2 is provided between the upper electrode 180 and interconnect 95.

In the present embodiment, the magnetoresistive effect element 100 includes a magnetic tunnel junction. The magnetic tunnel junction is formed of the two magnetic layers 110 and 120 and nonmagnetic layer 130. Hereinafter, the magnetoresistive effect element 100 including the magnetic tunnel junction is referred to as "MTJ element".

In the MTJ element 100, the nonmagnetic layer 130 is referred to as "tunnel barrier layer 130". The tunnel barrier layer 130 is a film including, for example, magnesium oxide (MgO).

The two magnetic layers 110 and 120 have magnetizations in certain directions. One magnetic layer 110 is a magnetic layer whose magnetization direction is variable. The other magnetic layer 120 is a magnetic layer whose magnetization direction is invariable. Hereinafter, the magnetic layer 110 with the variable magnetization direction is referred to as "storage layer 110", and the magnetic layer 120 with the invariable magnetization direction is referred to as "reference layer 120". In some cases, the storage layer 110 is called "free layer" or "magnetization free layer". In some cases, the reference layer 120 is called "pin layer", "pinned layer", "magnetization fixed layer", or "magnetization invariable layer".

Besides, that the magnetization direction of the reference layer 120 is "invariable" or "in the fixed state" means that the magnetization direction of the reference layer 120 does not change when a current or voltage for reversing the magnetization direction of the storage layer 110 is supplied to the MTJ element 100. A magnetization switching threshold value of the storage layer 110 and a magnetization switching threshold value of the reference layer 120 are controlled such that the magnetization direction of the reference layer 120 is invariable. The magnetization switching threshold value of the reference layer 120 is higher than the magnetization switching threshold value of the storage layer 110.

The storage layer 110 is a magnetic layer having a perpendicular magnetic anisotropy.

The perpendicular magnetic anisotropy is manifested in the storage layer 110 due to an interface magnetic anisotropy between the tunnel barrier layer 130 and storage layer 110. Thereby, the storage layer 110 has magnetization which is substantially perpendicular to the interface between the tunnel barrier layer 130 and storage layer 110. The magnetization direction (the direction of the magnetization easy axis) of the storage layer 110 is a direction which is substantially parallel to the direction of stacking of the two magnetic layers 110 and 120.

The storage layer 110 is a magnetic layer including at least two of cobalt (Co), iron (Fe), boron (B) and the like.

The reference layer 120 has a perpendicular magnetic anisotropy due to an interface magnetic anisotropy. The magnetization direction of the reference layer 120 is a direction which is substantially parallel to the direction of stacking of the two magnetic layers 110 and 120. The magnetization direction of the reference layer 120 is a direction which is substantially perpendicular to the plane of the magnetic layer 120.

For example, the reference layer 120 includes an artificial lattice including at least cobalt (Co) and platinum (Pt). For example, the film thickness of the reference layer 120 is greater than the film thickness of the storage layer 110. Thereby, the magnetization switching threshold value of the reference layer 120 becomes higher than the magnetization switching threshold value of the storage layer 110.

Besides, a magnetic layer (hereinafter referred to as "interface layer") including at least two of Co, Fe, B and the like may be provided between the artificial lattice of the reference layer 120 and the tunnel barrier layer 130.

A shift cancel layer 125 is provided between the reference layer 120 and the upper electrode 180. The shift cancel layer 125 is a magnetic layer for reducing a magnetostatic stray field of the reference layer 120. The direction of magnetization of the shift cancel layer 125 is opposite to the direction of magnetization of the reference layer 120. Thereby, an adverse effect (e.g. magnetic field shift) on the magnetization of the storage layer 110 due to the magnetostatic stray field of the reference layer 120 can be suppressed.

The direction of magnetization of the reference layer 120 and the direction of magnetization of the shift cancel layer 125 are set to be opposite to each other by a SAF (synthetic antiferromagnetic) structure.

In the SAF structure, an intermediate layer 129 is provided between the reference layer 120 and shift cancel layer 125. By the intermediate layer 129, the reference layer 120 and shift cancel layer 125 are antiferromagnetically coupled.

The intermediate layer 129 is, for example, a nonmagnetic metallic film of ruthenium (Ru) or the like.

For example, when Ru is used for the intermediate layer 129, the antiferromagnetic coupling force in the reference layer 120 and shift cancel layer 125 can be increased by adjusting the film thickness of the intermediate layer 129. Thereby, the magnetization directions of the reference layer 120 and shift cancel layer 125 are automatically stabilized in an antiparallel state.

Incidentally, it should suffice if the magnetization directions of the reference layer 120 and shift cancel layer 125 are antiparallel, and the magnetization directions are not limited to those in FIG. 2. In some cases, a stacked structure (SAF structure) including the magnetic layers 120 and 125 and intermediate layer 129 is called "reference layer".

The resistance state (resistance value) of the MTJ element 100 changes in accordance with a relative relationship (magnetization alignment) between the magnetization direction of the storage layer 110 and the magnetization direction of the reference layer 120.

When the magnetization direction of the storage layer 110 is identical to the magnetization direction of the reference layer 120 (when the magnetization alignment of the MTJ element 100 is in a parallel alignment state), the MTJ element 100 has a first resistance value R1. When the magnetization direction of the storage layer 110 is different from the magnetization direction of the reference layer 120 (when the magnetization alignment of the MTJ element 100 is in an antiparallel alignment state), the MTJ element 100 has a second resistance value R2 which is higher than the first resistance value R1.

In the present embodiment, the parallel alignment state in the MTJ element 100 is also described as "P state", and the antiparallel alignment state in the MTJ element 100 is also described as "AP state".

For example, when the memory cell MC stores data of 1 bit ("0" data or "1" data), first data (e.g. "0" data) is associated with the MTJ element 100 in the state (first resistance state) having the first resistance value R1. Second data (e.g. "1" data) is associated with the MTJ element 100 in the state (second resistance state) having the second resistance value R2.

As described above, in this embodiment, the MTJ element 100 using a perpendicular magnetization film (for example, called "perpendicular magnetization type MTJ element") is used for the memory element.

In the meantime, the MTJ element 100 may be an MTJ element in which the magnetization of the storage layer and reference layer is perpendicular to the direction of stacking of the magnetic layers (for example, called "parallel magnetization type MTJ element" or "in-plane magnetization type MTJ element"). In the parallel magnetization type MTJ element, the magnetization easy axis directions of the storage layer and reference layer are directions parallel to the planes of the magnetic layers.

The configuration of the MTJ element 100 is not limited to the example illustrated in FIG. 2. The order of stacking of the magnetic layers 110 and 120 in the MTJ element 100 can be changed as needed in accordance with the circuit configuration of the memory cell MC and the operation of the MRAM. For example, in the MTJ element 100, the reference layer 120 may be provided on the upper electrode side, and the storage layer 110 may be provided on the lower electrode side.

<Operational Principle of Memory Cells>

Figure 4:
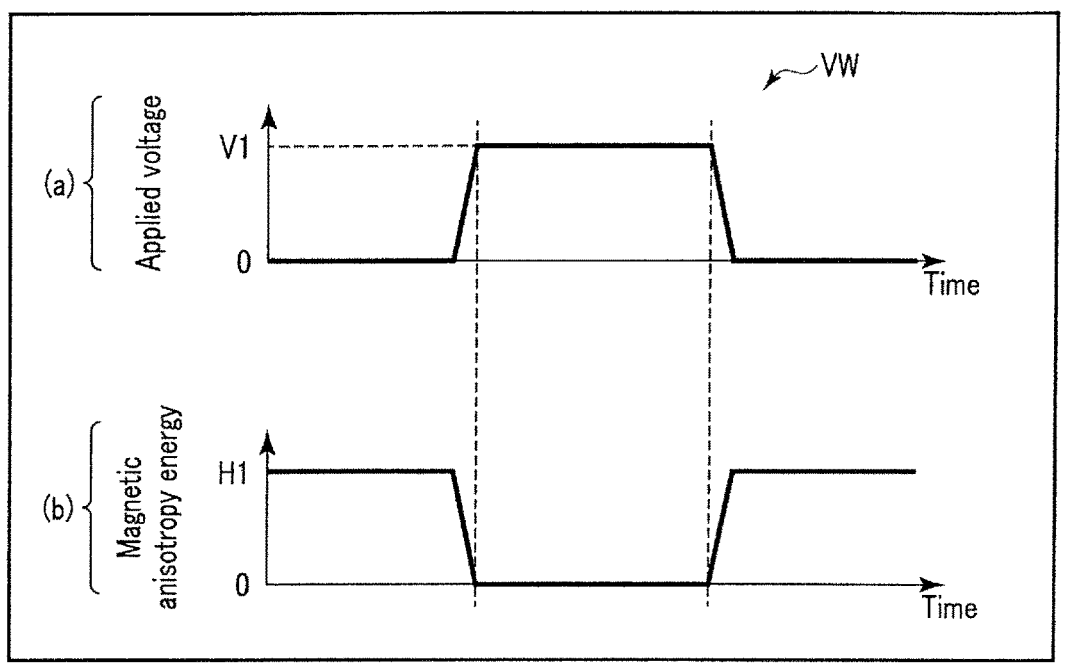
FIG. 4 is a view for describing the operational principle of the resistance change type memory of the embodiment.

Referring to FIG. 3 and FIG. 4, a description will be given of the operational principle of the memory cells of the MRAM of the present embodiment.

FIG. 3 is a schematic view for describing the operational principle of the memory cells in the MRAM of this embodiment.

A read operation in the MRAM is executed by passing a read current IR through the memory cell MC.

In the read operation of the MRAM, a voltage or current is supplied to the memory cell MC. Thereby, the read current IR flows in the MTJ element 100.

In order to prevent the resistance state of the MTJ element 100 from being erroneously switched at a read time, it is preferable that the direction of flow of the read current IR is set to be opposite to the direction of flow of a write current IW.

For example, in the write operation using a voltage effect (to be described later), in a voltage write type MRAM in which a write voltage VW for the MTJ element 100 has a positive voltage value, the write voltage VW that is higher than the voltage (voltage value) applied to the bit line BL is applied to the bit line bBL at the time of the write operation. In this case, the direction of flow of the write current IW due to the write voltage VW is a direction from the reference layer 120 toward the storage layer 110. Thus, it is preferable that the direction of flow of the read current IR is set to be a direction from the storage layer 110 toward the reference layer 120.

In addition, in a voltage write type MRAM in which the write voltage VW for the MTJ element 100 has a negative voltage value, the write voltage VW that is lower than the voltage applied to the bit line BL is applied to the bit line bBL at the time of the write operation. In this case, the direction of flow of the write current IW due to the write voltage VW is a direction from the storage layer 110 toward the reference layer 120. Thus, it is preferable that the direction of flow of the read current IR is set to be a direction from the reference layer 120 toward the storage layer 110.

In accordance with the resistance state of the MTJ element 100 in which the read current IR flows, a variation occurs in the charge potential of the bit line due to the supply of the read current IR, or in the potential of a certain node of the memory cell MC due to the application of the voltage, or in the magnitude of the read current IR which is output from the memory cell MC. Each of these potentials (voltage values) or the current value is compared with a certain reference value. Thereby, it is judged whether the data stored in the memory cell MC is "0" data or "1" data.

In the present embodiment, the write operation of the memory cell MC is executed by utilizing the voltage effect of the MTJ element.

In the write operation using the voltage effect, the magnetization alignment of the MTJ element is set to the antiparallel alignment state or parallel alignment state by the application of the write voltage VW to the MTJ element 100. In the description below, the method (i.e. write operation) of writing data to the MTJ element 100 by using the voltage effect is referred to as "voltage write". In this embodiment, the MRAM which utilizes the voltage effect for the write of data is referred to as "voltage write type MRAM (or voltage torque type MRAM)".

The voltage write type MRAM can execute data write by a unipolar operation.

In the example of FIG. 3, the write voltage VW of a certain voltage value is applied to the bit line bBL. A certain voltage is applied to the bit line BL. For example, in the voltage write type MRAM in which the write voltage VW is a positive voltage, the voltage value of the voltage applied to the bit line BL is less than the voltage value of the voltage applied to the bit line bBL. In addition, in the voltage write type MRAM in which the write voltage VW is a negative voltage, the voltage value of the voltage applied to the bit line BL is greater than the voltage value of the voltage applied to the bit line bBL. Whether the write voltage VW is a positive voltage or a negative voltage depends on the configuration of the MTJ element 100.

At this time, the current IW flows in the MTJ element 100 due to a potential difference between the two bit lines BL and bBL. For example, the direction of flow of the current IW is set to be opposite to the direction of flow of the read current IR. In the example of FIG. 3, the current IW flows from the reference layer 120 toward the storage layer 110.

In the voltage write type MRAM, the data to be written does not depend on the polarity of the voltage that is applied to the MTJ element 100.

In the voltage write type MRAM, by the supply of the write voltage VW to the bit line bBL, the direction of magnetization of the storage layer 110 can be set to be identical to the direction of magnetization of the reference layer 120, or the direction of magnetization of the storage layer 110 can be set to be opposite to the direction of magnetization of the reference layer 120.

In this manner, in the voltage write type MRAM, the magnetization alignment of the MTJ element can be changed by the supply of the voltage from one direction (bias direction).

Besides, the magnetic characteristics of the magnetic layers 110 and 120 are designed such that the switching threshold value of the reference layer 120 with respect to the voltage value is higher than the switching threshold value of the storage layer 110 with respect to the voltage value. Thus, even if the write voltage VW is applied to the MTJ element 100, the magnetization of the reference layer 120 is not switched.

The voltage write type MRAM can reduce power consumption at the time of the write operation, can reduce read disturb, and can improve the operational characteristics of the memory.

In the present embodiment, the write operation of the memory cell MC is executed by mainly utilizing the voltage effect of the MTJ element. However, in the MRAM of the present embodiment, a write principle by spin transfer torque (STT), a write principle by spin orbit torque (SOT), or the like may supplementarily be utilized in the write operation. For example, when the write principle by the spin transfer torque is supplementarily utilized in the MRAM of the present embodiment, the MRAM of this embodiment can induce magnetization switching of the storage layer by the STT by passing, through the MTJ element, such an electric current that the current value of write current IW due to the write voltage VW is greater than the magnetization switching threshold value of the storage layer by the STT.

Figure 5:
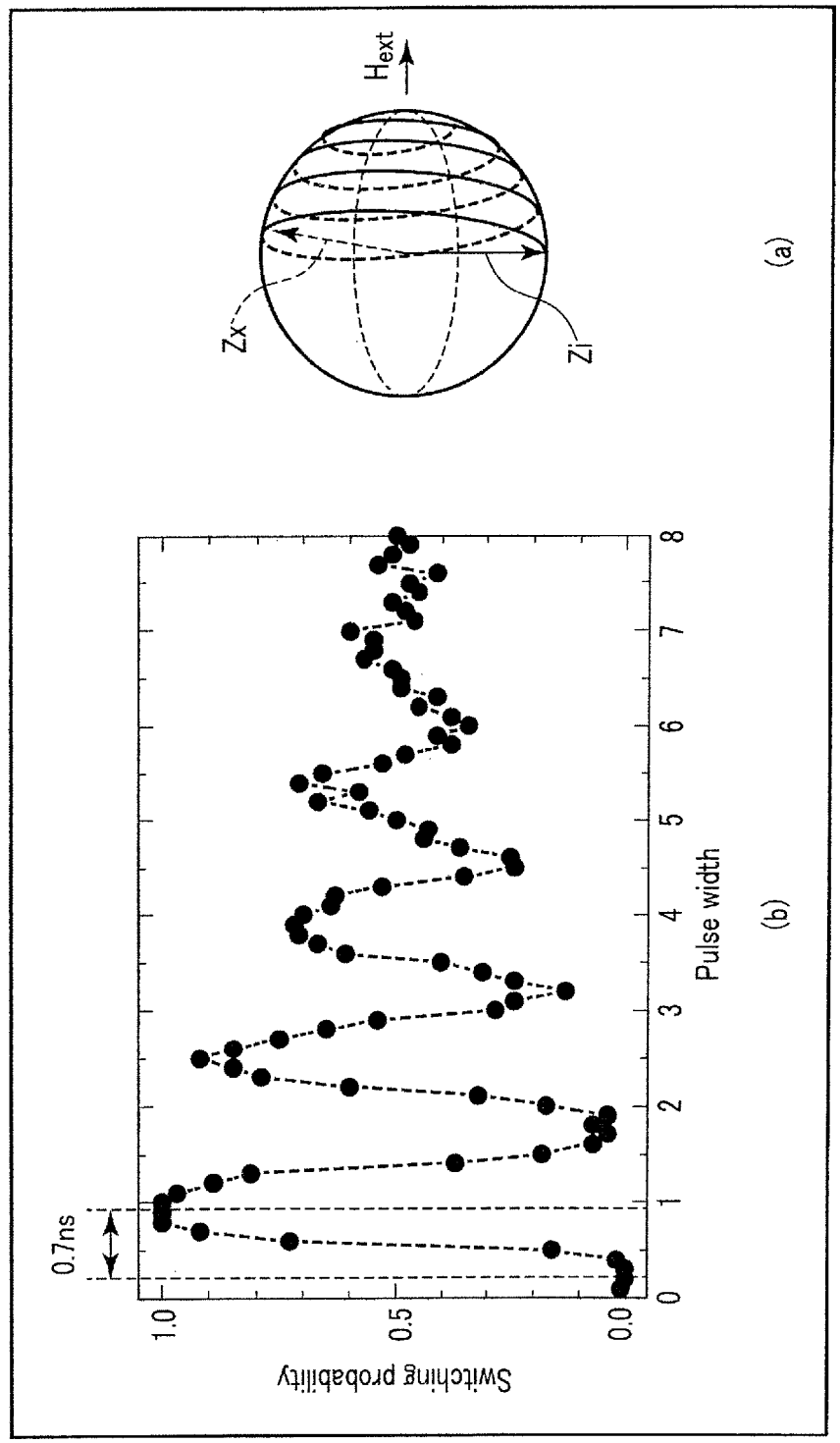
FIG. 5 is a view for describing the operational principle of the resistance change type memory of the embodiment.

FIG. 4 and FIG. 5 are schematic views for explaining the magnetization switching of the MTJ element by the voltage effect.

(a) and (b) of FIG. 4 are views illustrating a relationship between the voltage which is used for the magnetization switching of the MTJ element utilizing the voltage effect, and the magnetic anisotropy energy of the MTJ element.

In (a) of FIG. 4, the abscissa axis of the graph corresponds to time, and the ordinate axis of the graph corresponds to the voltage (voltage value) that is applied to the MTJ element. In (b) of FIG. 4, the abscissa axis of the graph corresponds to time, and the ordinate axis of the graph corresponds to the magnetic anisotropy energy of the MTJ element.

As illustrated in (a) of FIG. 4, when the magnetization of the storage layer of the MTJ element is switched by the voltage effect, the write voltage VW is applied to the MTJ element 100.

The write voltage VW has a voltage value V1. The voltage value of the write voltage VW is set at the voltage value V1 during a first period. For example, the voltage value V1 is an upper limit value of the write voltage VW. However, when the write voltage is applied to the MTJ element, there is a case in which a part of an upper end of the write voltage VW overshoots and becomes higher than the voltage value V1. In this case, too, the most part of the upper end of the write voltage VW in the first period is set at the voltage value V1.

For example, the voltage value V1 is applied to the reference layer 120 side of the MTJ element 100, A ground voltage (0 V) is applied to the storage layer 110 side of the MTJ element 100. Thereby, a potential difference of the MTJ element 100 due to the application of the write voltage VW is set to the voltage value V1.

As illustrated in (b) of FIG. 4, when no voltage is applied to the MTJ element 100 (i.e. when a voltage of 0 V is applied to the MTJ element 100), the MTJ element 100 retains a resistance state with the magnetic anisotropy energy of a certain magnitude (intensity) H1.

By the voltage VW being applied to the MTJ element 100, the magnetic anisotropy energy in the MTJ element 100 is reduced in accordance with the magnitude of the voltage. For example, the magnetic anisotropy energy acts in a perpendicular direction to the plane of the magnetic layer (the interface between the magnetic layer and tunnel barrier layer).

By setting the magnitude of the voltage, which is applied to the MTJ element 100, to a certain voltage value V1, the magnitude of the magnetic anisotropy energy of the MTJ element 100 can be reduced to substantially zero.

In this manner, a precession movement of magnetization of the storage layer 110 of the MTJ element 100 can be induced by reducing the magnetic anisotropy energy of the MTJ element 100.

(a) of FIG. 5 is a view which schematically illustrates a movement of magnetization of the magnetic layer by the voltage effect. In (a) of FIG. 5, the magnetic layer is modeled in a spherical shape.

As illustrated in (a) of FIG. 5, before the application of the write voltage VW, the magnetic layer (storage layer) has a magnetization (hereinafter referred to as "initial-state magnetization") Zi which is set in a certain direction.

When the write voltage VW of a certain voltage value V1 is applied to the MTJ element 100, a movement of magnetization of the storage layer 110 is induced by the reduction of magnetic anisotropy energy. The initial-state magnetization Zi starts a precession movement.

In the MTJ element 100 to which the write voltage VW is applied, a magnetization Zx in a precession movement state rotates in the magnetic layer 110, with the direction of a magnetic field Hext being the center axis.

By the precession movement of the magnetization Zx, the direction of magnetization of the storage layer 110 varies.

By the stop of supply of the voltage VW, the precession movement of the magnetization Zx of the storage layer 110 stops.

In the voltage write, at a timing when the direction of magnetization of the storage layer 110 has changed from the direction of the initial-state magnetization Zi to the direction opposite to the direction of the initial-state magnetization Zi (i.e. at a timing when the magnetization has rotated over 180°), the supply of the write voltage VW stops.

As a result, the direction of magnetization of the storage layer 110 is reversed.

In the voltage write type MRAM, the pulse width of the write voltage VW is set such that the precession movement of magnetization of the storage layer 110 stops at the timing when the magnetization direction of the storage layer 110 has changed from the initial-state direction to the opposite direction.

(b) of FIG. 5 is a graph illustrating the relationship between the pulse width of the write voltage and the switching probability of the MTJ element. In (b) of FIG. 5, the abscissa axis of the graph corresponds to the pulse width of the write voltage (the application time of a certain voltage value), and the ordinate axis of the graph corresponds to the switching probability of the MTJ element. The switching probability is indicated by a value in a range of 0 to 1. The unit of the pulse width is a nanosecond (nsec). Besides, the switching probability is a probability indicative of a success/failure of magnetization switching of the storage layer relative to a certain number of trials. When the switching probability is 1, this indicates that the number of times of success of magnetization switching of the storage layer is highest.

As indicated in (b) of FIG. 5, in accordance with the increase of the pulse width of the write voltage VW, the switching probability cyclically increases and decreases. (b) of FIG. 5 shows a tendency that the switching probability becomes lower as the pulse width (application time) of the write voltage VW becomes greater.

In the example illustrated in (b) of FIG. 5, a highest switching probability is indicated when the pulse width of the write voltage VW is set in a range of about 0.5 nsec to about 1.0 nsec. However, the pulse width of the write voltage, at which the switching probability is highest, varies depending on, for example, the magnitude of the write voltage VW and the characteristics of the MTJ element. Thus, the pulse width of the write voltage, at which the switching probability is highest, is not limited to 0.5 nsec to about 1.0 nsec.

In this manner, the reliability of data write of the voltage write type MRAM depends on the control of the pulse width of the write voltage VW.

It is desirable, therefore, that the pulse width of the write voltage be finely controlled such that the pulse width of the write voltage (the application time of a certain voltage value) falls within a certain range. In the present embodiment, the write circuit 16 controls the pulse width of the write voltage.

Hereinafter, the configuration of the write circuit, which can control the supply of the write voltage VW in the MRAM of this embodiment, will be described more concretely.

(b) Circuit configuration

FIG. 6 is an equivalent circuit diagram illustrating a configuration example of the memory cell array and write circuit of the MRAM of the present embodiment.

As illustrated in FIG. 6, a plurality (m) of word lines WL (WL<0>, WL<1>, . . . , WL<m−1>) are provided in the memory cell array 10. A plurality (n) of bit lines BL (BL<0>, BL<1>, . . . , BL<n−1>) and a plurality (n) of bit lines bBL (bBL<0>, bBL<1>, . . . , bBL<n−1>) are provided in the memory cell array 10. One bit line BL and one bit line bBL constitute one bit line pair.

A plurality of memory cells MC are arranged in a matrix in the memory cell array 10.

A plurality of memory cells MC, which are arranged in an x direction (row direction), are connected to a common word line WL. The word line WL is connected to the above-described row control circuit 13B. Based on the decoded result of the row address, the row control circuit 13B controls the potential of the word line WL. Thereby, the word line WL (row) indicated by the row address is selected and activated.

A plurality of memory cells MC, which are arranged in a y direction (column), are commonly connected to two bit lines BL and bBL which belong to one bit line pair.

One end of the MTJ element 100 is connected to the bit line bBL. The other end of the MTJ element 100 is connected to one end (one of the source/drains) of the cell transistor 200. The other end (the other of the source/drains) of the cell transistor 200 is connected to the bit line BL. The memory cell MC stores data of 1 bit or more, based on the associating between the resistance state (resistance value) of the MTJ element 10 and data.

In FIG. 6, for example, the memory cell array 10 has a configuration of a hierarchical bit line method. In this case, global bit lines GBL and bGBL are provided in the memory cell array 10.

The global bit line GBL is connected to the bit lines BL via switch elements M1 (M1<0>, M1<1> . . . , M1<n−1>). The global bit line bGBL is connected to the bit lines BL via switch elements M2 (M2<0>, M2<1> . . . , M2<n−1>). Hereinafter, for the purpose of distinction in the description, the bit lines BL and bBL are referred to as "local bit lines BL and bBL" in some cases.

The switch element M1, M2 is, for example, an N-type field-effect transistor. The switch element M1, M2 may be treated as a constituent element of the above-described column control circuit 14B.

The gates of the respective transistors M1 are supplied with corresponding control signals CSA (CSA<0>, CSA<1>, . . . , CSA<n−1>) as column select signals. The gates of the respective transistors M2 are supplied with corresponding control signals CSB (CSB<0>, CSB<1>, . . . , CSB<n−1>) as column select signals. For example, based on the decoded result of the column address, the column control circuit 14B controls the signal levels of the control signal CSA, CSB.

When the transistors M1 and M2 are set in an ON state in accordance with the operation which are requested for the MRAM and column address, the bit lines BL and bBL are electrically connected to the global bit lines GBL and bGBL.

Hereinafter, a memory cell, which was selected as a memory cell of an operation target on the basis of the address from the outside, is referred to as "selected cell".

Besides, although a pair of the global bit lines GBL and bGBL is illustrated in FIG. 6, a plurality of pairs of global bit lines GBL and bGBL may be provided in the memory cell array 10 in accordance with the configuration of the memory cell array 10. In this case, each pair of global bit lines GBL and bGBL is used as one control unit. Thereby, one pair of global bit lines GBL and bGBL is independently driven, or a plurality of pairs of global bit lines GBL and bGBL are driven in parallel.

For example, a read driver 150 of the read circuit 15 is connected to the global bit line GBL. A sense amplifier circuit 151 of the read circuit 15 is connected to the global bit line bGBL.

At the time of the read operation, the read driver 150 supplies a voltage or current for data read to the selected cell via the bit lines BL and GBL.

The sense amplifier circuit 151 senses a current or voltage which is output from the selected cell to the bit lines bBL and bGBL. The sense amplifier circuit 151 compares the magnitude of the sensed current/voltage with a reference value. Thereby, the sense amplifier circuit 151 judges the data in the selected cell. The judgment result of the sense amplifier circuit 151 is sent to the outside (e.g. memory controller) of the MRAM as the data in the selected cell.

In the meantime, the read driver 150 and sense amplifier 151 may be connected to the local bit lines BL and bBL.

The operations (activation) of the read driver 150 and sense amplifier circuit 151 are controlled by control signals SE and RE and inverted signals thereof, respectively.

In the MRAM of the present embodiment, the write circuit 16 is connected to the local bit lines bBL.

The write circuit 16 includes at least a write driver 160 and an equalizer circuit (write voltage control circuit) 165.

The write driver 160 controls the supply of voltage from voltage lines 900A, 900B and 900C to the equalizer circuit 165. The operation (activation) of the write driver 160 is controlled by a control signal WE and an inverted signal thereof.

The write driver 160 drives the voltage lines 900 (900A, 900B and 900C). Voltages generated by the voltage generation circuit 17 are supplied to the voltage lines 900A, 900B and 900C. For example, a voltage of 0 V (ground voltage VSS) is applied to the voltage lines 900A and 900C. A voltage (voltage value) V1 is applied to the voltage line 900B. In this example, the voltage V1 corresponds to the set voltage value of the upper limit of the write voltage VW.

For example, the voltage lines 900A, 900B and 900C are provided in an area neighboring the memory cell array 10 (hereinafter, also referred to as "voltage line area") 90.

The voltage lines 900A, 900B and 900C are global interconnects. The voltage lines 900A, 900B and 900C are used as interconnects for data write.

The potential (voltage value) of each of the voltage lines 900A, 900B and 900C may be precharged. In this case, the potential of each of the voltage lines 900A, 900B and 900C is set to a potential for generating the write voltage VW, before executing the write operation.

FIG. 6 illustrates an example in which the voltage line area 90 is provided on one end side of the direction of extension of the word lines. However, the voltage line area 90 may be provided on one end side and the other end side of the direction of extension of the word lines WL such that the memory cell array 10 is interposed between the voltage line areas 90. The voltage line area 90 may be provided in the memory cell array 10.

Besides, the write circuit for supplying the voltage to the bit lines BL may be connected to the global bit line GBL.

The equalizer circuit 165 is provided on one end side of the memory cell array 10 in a direction (e.g. the direction of extension of bit lines) crossing the direction of extension of the word lines WL.

The equalizer circuit 165 is connected to the local bit lines bBL.

The equalizer circuit 165 includes a plurality of control elements TRA, TRB and TRC corresponding to the respective bit lines bBL and respective voltage lines 900A, 900B and 900C. The control elements TRA, TRB and TRC are N-type field-effect transistors. The transistors TRA, TRB and TRC are arranged in a matrix.

The equalizer circuit 165 controls the order of activation/inactivation of the transistors TRA, TRB and TRC, thereby supplying the write voltage VW of a predetermined pulse shape from the voltage lines 900 to the memory cells MC.

In accordance with the order of operations of the transistors TRA, TRB and TRC, the order of connections between the voltage lines 900A, 900B and 900C and the bit line bBL is controlled.

The equalizer circuit 165 electrically connects the bit line bBL and the voltage line 900 by capacitive coupling. In the present embodiment, the equalizer circuit 165 is also referred to as "capacitive coupling circuit".

The transistor TRA controls the connection between the voltage line 900A and the local bit line bBL. For example, the number of transistors TRA is equal to the number of local bit lines bBL. The respective transistors TRA (TRA<0>, TRA<1>, . . . , TRA<n–2>, TRA<n–1>) correspond to the local bit lines bBL (bBL<0>, bBL<1>, . . . , bBL<n–2>, bBL<n–1>) in a one-to-one correspondence.

One end of the transistor TRA is connected to the voltage line 900A. The other end of the transistor TRA is connected to the corresponding bit line bBL.

Control signals WDA (WDA<0>, WDA<1>, . . . , WDA<n–2>, WDA<n–1>) are supplied to the gates of the respective transistors TRA. Based on the control signal WDA, the ON/OFF of each transistor TRA is controlled independently from the other transistors TRA. Of the plural transistors TRA, one transistor TRA corresponding to the select address ADR is selected by the control signal WDA. For example, based on the address ADR, the control signal WDA is supplied from the column decoder 14A or column control circuit 14B.

The transistor TRB controls the connection between the voltage line 900B and the local bit line bBL. For example, the number of transistors TRB is equal to the number of local bit lines bBL. The respective transistors TRB (TRB<0>, TRB<1>, . . . , TRB<n–2>, TRB<n–1>) correspond to the local bit lines bBL (bBL<0>, bBL<1>, . . . , bBL<n–2>, bBL<n–1>) in a one-to-one correspondence.

One end of the transistor TRB is connected to the voltage line 900B. The other end of the transistor TRB is connected to the corresponding bit line bBL.

Control signals WDB (WDB<0>, WDB<1>, . . . , WDB<n–2>, WDB<n–1>) are supplied to the gates of the respective transistors TRB. Based on the control signal WDB, the ON/OFF of each transistor TRB is controlled independently from the other transistors TRB. Of the plural transistors TRB, one transistor TRB corresponding to the select address ADR is selected by the control signal WDB. For example, based on the address ADR, the control signal WDB is supplied from the column decoder 14A or column control circuit 14B.

The transistor TRC controls the connection between the voltage line 900C and the local bit line bBL. For example, the number of transistors TRC is equal to the number of local bit lines bBL. The respective transistors TRC (TRC<0>, TRC<1>, . . . , TRC<n-2>, TRC<n-1>) correspond to the local bit lines bBL (bBL<0>, bBL<1>, . . . , bBL<n-2>, bBL<n-1>) in a one-to-one correspondence.

One end of the transistor TRC is connected to the voltage line 900C. The other end of the transistor TRC is connected to the corresponding bit line bBL.

Control signals WDC (WDC<0>, WDC<1>, . . . , WDC<n-2>, WDC<n-1>) are supplied to the gates of the respective transistors TRC. Based on the control signal WDC, the ON/OFF of each transistor TRC is controlled independently from the other transistors TRC. Of the plural transistors TRC, one transistor TRC corresponding to the select address ADR is selected by the control signal WDC. For example, based on the address ADR, the control signal WDC is supplied from the column decoder 14A or column control circuit 14B.

Besides, the control signals WDA, WDB and WDC may be supplied from the control circuit 18, based on the address ADR.

For example, the transistors TRA, TRB and TRC are connected to the voltage lines 900A, 900B and 900C, respectively, via interconnects extending in a direction parallel to the direction of extension of the word lines WL. For example, the voltage lines 900 extend in a direction parallel to the direction of extension of the bit lines BL and bBL.

The local bit lines bBL and voltage lines 900A, 900B and 900C are capacitive-coupled by the transistors TRA, TRB and TRC. In the present embodiment, the connections by capacitive coupling between the local bit lines bBL and voltage lines 900A, 900B and 900C are sequentially switched by the control of activation/inactivation of the transistors TRA, TRB and TRC.

In the MRAM 1 of the present embodiment, a difference in capacitance occurs between the local bit line bBL and the voltage line 900A, 900B, 900C. Thus, in the MRAM 1 of this embodiment, it is possible to decrease a voltage drop at a time of capacitive coupling between the local bit line bBL and voltage line 900A, 900B, 900C.

Accordingly, in the MRAM 1 of this embodiment, the sizing of the driver (circuit) 160 can be relaxed.

In the write circuit 16 of the MRAM 1 of this embodiment, three transistors TRA, TRB and TRC are connected to one bit line bBL. The ON/OFF timing of the transistors TRA, TRB and TRC is controlled, and thereby the write voltage VW of a predetermined pulse shape is supplied to the bit line bBL.

For example, in the write circuit 16 of the MRAM of the present embodiment, the ON/OFF of the transistors TRA, TRB and TRC that are connected to the selected bit line bBL is controlled at a timing corresponding to the pulse shape of the write voltage, and thereby the write voltage VW having a desired pulse width can be supplied to the memory cell MC.

(b) Operation Example

Figure 7:
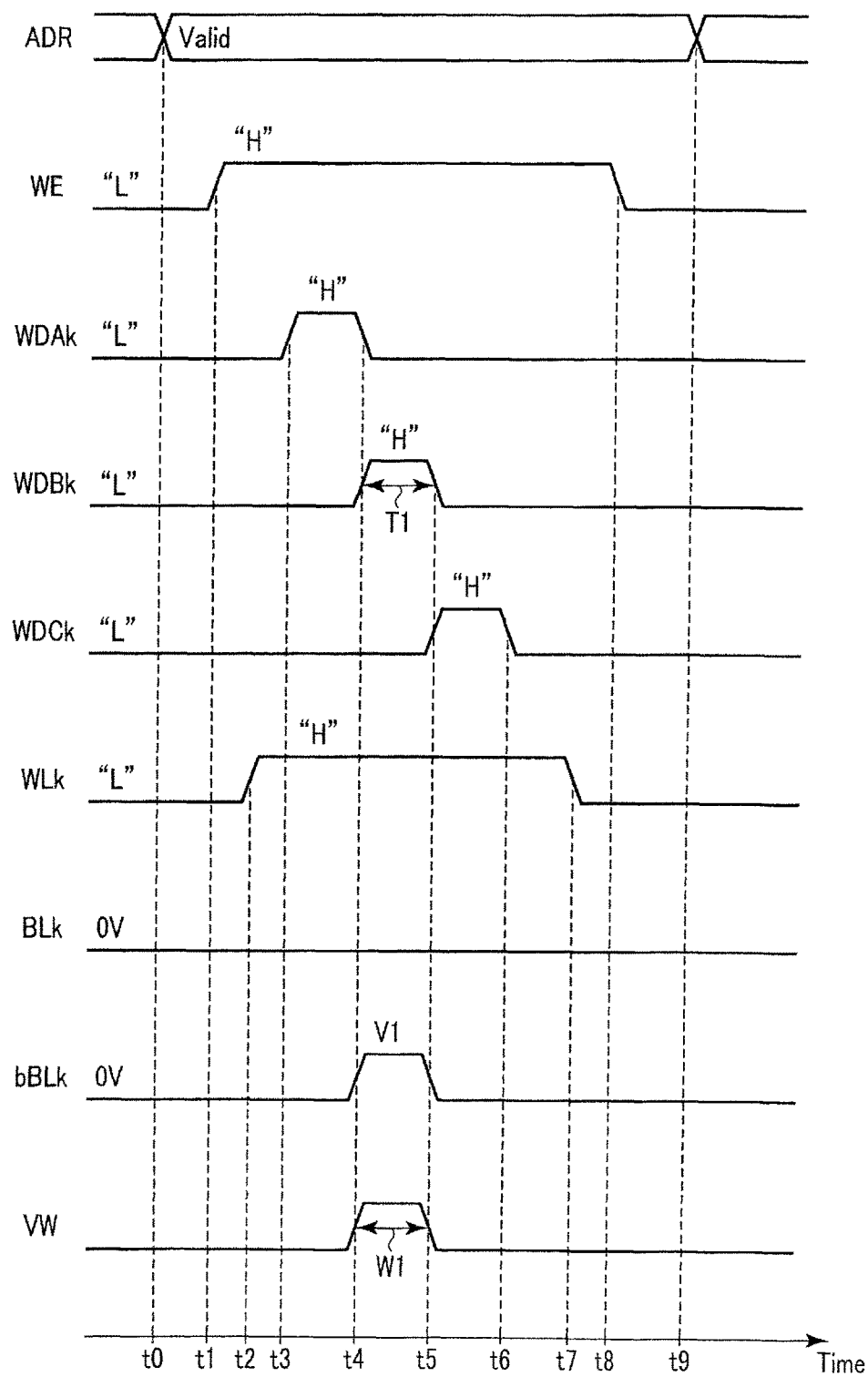
FIG. 7 is a timing chart illustrating an operation example of the resistance change type memory of the first embodiment.

Referring to FIG. 7, an operation example of the MRAM of this embodiment will be described.

Here, also referring to FIG. 1 to FIG. 6 as needed, the operation of the MRAM of this embodiment is described.

FIG. 7 is a timing chart for describing the write operation of the MRAM of the embodiment. In FIG. 7, "WLk" indicates a selected word line of the plural word lines WL, and "BLk" and "bBLk" indicate selected bit lines of the plural bit lines BL and bBL. "WDAk", "WDBk" and "WDCk" indicate control signals corresponding to the selected address among the plural control signals WDA, WDB and WDC.

In the description below, "H(High)" level corresponds to an ON voltage of an N-type transistor, and "L(Low)" level corresponds to an OFF voltage of the N-type transistor.

In the present embodiment, the MRAM 1 starts the write operation, for example, upon receiving the command CMD and address ADR from the memory controller (or host device) 5.

As illustrated in FIG. 7, at time instant t0, after the reception of the command CMD and address ADR, the address ADR is latched in the command/address latch circuit 11. Thereby, the address ADR becomes valid.

At time instant t1, the control circuit 18 changes a write enable signal WE from "L" level to "H" level. By the signal WE of "H" level, the write circuit 16 is activated.

The write driver 160 drives the voltage lines 900A, 900B and 900C. Thereby, the write circuit 16 is set in a state in which a voltage can be transferred from each voltage line 900 to the bit line bBLk. The potential (voltage value) of each voltage line 900A, 900B, 900C is preset to a potential for generating the write voltage VW.

For example, the write driver 160 applies a voltage of 0 V to the bit line BLk.

Besides, the driver circuit 150 that is connected to the global bit line GBL may apply a voltage of 0 V to the bit line BLk via the transistor M1 which is set in the ON state by the control signal CSA. As will be described later, a voltage which is higher than 0 V may be applied to the bit line BLk.

At time instant t2, based on the decoded result of the address ADR by the row decoder 13A, the row control circuit 13B supplies a signal of "H" level to the selected word line WLk. Thereby, the cell transistor 200 connected to the selected word line WLk is turned on.

Thereafter, based on the address ADR, the signal levels of the control signals WDAk, WDBk and WDCk are controlled. Thereby, the transistors TRA, TRB and TRC corresponding to the selected bit line bBLk are selected from among the plural transistors TRA, TRB and TRC in the equalizer circuit 165. The write voltage VW is supplied to the selected cell MC via the transistors TRA, TRB and TRC in the equalizer circuit 165.

In the meantime, during the write operation, the signals WDA, WDB and WDC other than the signals WDAk, WDBk and WDCk corresponding to the selected address are set at "L" level. Therefore, the unselected bit lines bBLk are electrically disconnected from the voltage lines 900.

In addition, the control signal CSB is set at "L" level. Therefore, the sense amplifier circuit 151 is electrically disconnected from the bit lines bBLk by the transistor M2 that is in the OFF state.

At time instant t3, the equalizer circuit 165 sets the signal level of the signal WDAk, among the control signals WDAk, WDBk and WDCk corresponding to the address ADR, to "H" level, and sets the signal levels of the other signals WDBk and WDCk to "L" level.

By the signal WDA of "H" level, the transistor TRA among the transistors TRA, TRB and TRC connected to the selected bit line bBLk is set in the ON state. Thereby, by capacitive coupling, the voltage line 900A and bit line bBLk are electrically connected. A voltage of 0 V is supplied from the voltage line 900A to the bit line bBLk via the transistor TRA that is in the ON state.

During the period in which the transistor TRA is in the ON state, the transistors TRB and TRC are set in the OFF state. Therefore, the voltage lines 900B and 900C are electrically disconnected from the bit line bBLk.

At time instant t4, the equalizer circuit 165 changes the signal level of the signal WDAk from "H" level to "L" level.

The equalizer circuit 165 sets the signal level of the signal WDAk at "L" level, and also sets the signal level of the signal WDBk, among the control signals WDAk, WDBk and WDCk corresponding to the address ADR, at "H" level. The signal level of the signal WDCk is kept at "L" level.

In continuity with the timing of turn-off of the transistor TRA, the transistor TRB is set in the ON state. Thereby, the voltage line 900B and bit line bBLk are electrically connected by capacitive coupling. The voltage (voltage value) V1 is supplied to the bit line bBLk from the voltage line 900B via the transistor TRB that is in the ON state. During the period in which the transistor TRB is in the ON state, the transistors TRA and TRC are set in the OFF state. Therefore, the voltage lines 900A and 900B are electrically disconnected from the bit line bBLk.

Since the bit line BLk is set at 0 V, the potential difference between the bit lines BLk and bBLk is the voltage value V1. For example, the voltage value V1 is a value in a range of 1.0 V to 1.5 V.

In the MRAM of the present embodiment, the information of the pulse width of the write voltage VW is stored in the control circuit 18, for example, as setup information. Based on the control signal (information) from the control circuit 18, the equalizer circuit 165 keeps the signal level of the signal WDBk at "H" level during a period T1 corresponding to the setup information relating to the pulse width of the write voltage VW.

In the period T1, the signal WDBk is set at "H" level. Thereby, the write voltage VW having a pulse width W1, which is set up for the magnetization switching of the storage layer, is supplied to the selected cell MCk via the bit line bBLk. The write voltage VW has the predetermined voltage value V1.

During the period in which the voltage value of the write voltage VW is the voltage value V1, the current flowing in the MTJ element 100 is relatively small. As a result, a variation of the voltage value of the write voltage due to the current flowing through the selected cell is suppressed.

Besides, in the present embodiment, the period T1 may be defined based on the full-width at half-maximum of the signal WDBk, or may be defined based on a period in which the signal WDBk has a fixed voltage value which is higher than 0 V.

In addition, in this embodiment, the pulse width W1 of the write voltage VW may be defined based on the full-width at half-maximum of the write voltage VW, or may be defined based on a period in which the pulse width W1 of the write voltage VW has the voltage value V1.

At time instant t5 after the passage of the period T1, the equalizer circuit 165 changes the signal level of the signal WDBk from "H" level to "L" level. The supply of the voltage V1 to the bit line bBLk is stopped.

Along with this, the equalizer circuit 165 changes the signal level of the signal WDCk from "L" level to "H" level. Thereby, the voltage line 900C and bit line bBLk are electrically connected by capacitive coupling. A voltage of 0 V is supplied to the bit line bBL from the voltage line 900C via the transistor TRC that is in the ON state.

During the period in which the transistor TRC is in the ON state, the transistors TRA and TRB are set in the OFF state. Therefore, the voltage lines 900A and 900B are electrically disconnected from the bit line bBLk.

At time instant t6, the equalizer circuit 165 changes the signal level of the signal WDCk from "H" level to "L" level. By the signal WDCk of "L" level, the transistor TRC is turned off.

Thereby, the transistors TRA, TRB and TRC that are connected to the selected bit line bBLk electrically disconnect the voltage line 900 from the selected bit line bBLk. Thereafter, the bit lines BLk and bBLk are inactivated.

At time instant t7, the row control circuit 13B sets the potential of the selected word line WLk at "L" level. Thereby, the cell transistor 200 is turned off.

At time instant t8, the control circuit 18 changes the signal level of the write enable signal WE from "H" level to "L" level. Thereby, the write circuit 16 including the write driver 160, equalizer circuit 165 and the like is inactivated.

At time instant t9, the address in the command/address latch circuit 11 is invalidated.

By the above, the write operation of the MRAM of the present embodiment is completed. For example, the MRAM 1 notifies the memory controller 5 of the completion of the write, operation.

By the above operation, the MRAM of the present embodiment terminates the write operation.

The read operation of the MRAM of this embodiment is executed by a well-known operation. Therefore, a description of the read operation of the MRAM of this embodiment is omitted.

(c) Modification

Referring to FIG. 8, a modification of the MRAM of the present embodiment will be described.

FIG. 8 is an equivalent circuit diagram for describing a modification of the write circuit in the MRAM of the embodiment.

In FIG. 8, the number of voltage lines provided in the voltage line area 90 is different from the example of FIG. 6.

As illustrated in FIG. 8, two voltage lines 900A and 900B for generating the write voltage VW are provided in the voltage line area 90.

The transistors TRA and TRC are connected to the voltage line 900A which is set at 0 V.

The voltages, which are supplied to the bit line bBLk via the transistors TRA and TRC before and after the supply of the voltage value V1, are the same voltage (e.g. 0 V).

Therefore, the voltage lines connected to the transistors TRA and TRC can be made common.

Accordingly, in the MRAM of the present modification, the number of voltage lines in the voltage line area can be reduced.

As a result, in the MRAM of this modification, the storage density of the memory can be improved, and/or the manufacturing cost can be reduced.

(d) Summary

In the resistance change type memory of the present embodiment (for example, a magnetic memory such as an MRAM), the supply of the write voltage to the selected cell is executed by the write circuit including the equalizer circuit that is connected to the local bit line.

The plural transistors in the equalizer circuit connect the plural voltage lines, which are set at the voltage values for forming the write voltage, to the bit line by capacitive coupling between interconnects.

In the resistance change type memory of the present embodiment, the voltage for generating the write voltage can be supplied from the precharged voltage lines to the bit line by capacitive coupling between the bit line and voltage lines.

Therefore, in the resistance change type memory of this embodiment, the speed of the write operation can be increased.

In the magnetic memory of this embodiment, the order of activation/inactivation of the transistors is controlled, thereby supplying the write voltage having the predetermined pulse shape to the selected cell.

Thereby, the resistance change type memory of the present embodiment can finely control the pulse shape of the write current by the relatively simple circuit configuration and power supply network configuration.

As a result, the resistance change type memory of the present embodiment can execute, with high reliability, the write of data utilizing the voltage effect.

In addition, in the resistance change type memory of this embodiment, the local bit line and voltage line are electrically connected by capacitive coupling via the transistor that is in the ON state. At this time, a difference in capacitance occurs between the local bit line and voltage line.

Thus, the resistance change type memory of this embodiment can reduce the voltage drop at the time of capacitive coupling between the local bit line and voltage line. Accordingly, the magnetic memory of this embodiment can relax the restrictions relating to the configuration (e.g. the circuit scale) of the write circuit.

Besides, when the resistance change type memory of the present embodiment is the voltage write type MRAM, the memory of this embodiment can obtain the above-described advantageous effects. Therefore, the voltage write type MRAM can be realized with the relatively simple configuration and low cost.

As has been described above, the resistance change type memory of the present embodiment can improve the operational characteristics of the memory.

(2) Second Embodiment

Referring to FIG. 9 to FIG. 11, a resistance change type memory of a second embodiment will be described.

FIG. 9 is a schematic view for schematically describing a circuit configuration of a resistance change type memory (e.g. MRAM) of the present embodiment.

As illustrated in FIG. 9, in the MRAM of this embodiment, the write circuit 16 includes a circuit 169 which controls the operation timings of the transistors TRA, TRB and TRC in the equalizer circuit 165. Hereinafter, the circuit 169 which controls the operation timings of the transistors in the equalizer circuit 165 is referred to as "timing control circuit 169".

The timing control circuit 169 controls the signal levels of the signals WDA, WDB and WDC such that the transistors TRA, TRB and TRC connected to the selected bit line bBLk are set in the ON state and OFF state at desired timings.

The timing control circuit 169 includes a plurality of control units 60 which correspond to the respective bit lines bBL. Based on one signal DS, one control unit 60 controls the ON/OFF of the transistors TRA, TRB and TRC connected to one bit line bBL. The signal DS functions as a trigger of driving of the transistors TRA, TRB and TRC. Hereinafter, the signal DS is also called "trigger signal DS".

For example, based on the address ADR, the trigger signal DS is supplied to the control unit 60 corresponding to the selected cell.

FIG. 10 is an equivalent circuit diagram for describing a configuration example of the timing control circuit 169 in the MRAM of the present embodiment. For the purpose of simple illustration, FIG. 10 illustrates the control unit 60 corresponding to one bit line bBLk in the timing control circuit 169. Besides, the number of control units 60 in the timing control circuit 169 corresponds to the number of bit lines bBL in the memory cell array 10.

One control unit 60 controls the ON and OFF of the three transistors TRA, TRB and TRC connected to one bit line bBLk.

The control unit 60 includes at least a plurality of AND gates 600A, 600B and 600C, a plurality of NOR gates 601A and 601B, and an inverter 605.

A first input terminal of the AND gate 600A is connected to an interconnect 608. The trigger signal DS is supplied to the interconnect 608. A second input terminal of the AND gate 600A is connected to an output terminal of the NOR gate 601A.

An output terminal of the AND gate 600A is connected to an interconnect 609A. The AND gate 600A outputs a control signal WDA from the output terminal thereof. The gate of the transistor TRA is connected to the interconnect 609A.

The output signal WDA of the AND gate 600A has a signal level based on a calculation result between the signal DS and an output signal of the NOR gate 601A.

A first input terminal of the AND gate 600B is connected to the interconnect 609A. A second input terminal of the AND gate 600B is connected to an output terminal of the NOR gate 601B.

An output terminal of the AND gate 600B is connected to an interconnect 609B. The AND gate 600B outputs a control signal WDB from the output terminal thereof. The gate of the transistor TRB is connected to the interconnect 609B.

The output signal WDB of the AND gate 600B has a signal level based on a calculation result between a signal level on the interconnect 609A (the potential of interconnect 609A) and an output signal of the NOR gate 601B.

A first input terminal of the AND gate 600C is connected to the interconnect 609B. A second input terminal of the AND gate 600C is connected to an output terminal of the inverter 605.

An output terminal of the AND gate 600C is connected to an interconnect 609C. The AND gate 600C outputs a control signal WDC from the output terminal thereof. The gate of the transistor TRC is connected to the interconnect 609C.

The output signal WDC of the AND gate 600C has a signal level based on a calculation result between a signal level on the interconnect 609B (the potential of interconnect 609B) and an output signal of the inverter 605.

The NOR gate 601A has three input terminals.

The signal WDA is supplied to a first input terminal of the NOR gate 601A. The first input terminal of the NOR gate 601A is connected to the interconnect 609A. The signal WDB is input to a second input terminal of the NOR gate 601A. The signal WDC is supplied to a third input terminal of the NOR gate 601A. For example, the second input terminal of the NOR gate 601A is connected to the interconnect 609B, and the third input terminal of the NOR gate is connected to the interconnect 609C.

The output terminal of the NOR gate 601A is connected to the input terminal of the AND gate 600A. The calculation result of the NOR gate 601A is supplied to the AND gate 600A.

The NOR gate 601B has two input terminals.

The signal WDB is supplied to a first input terminal of the NOR gate 601B. For example, the first input terminal of the NOR gate 601B is connected to the interconnect 609B. The signal WDC is input to a second input terminal of the NOR gate 601B. For example, the second input terminal of the NOR gate 601B is connected to the interconnect 609C.

An output terminal of the NOR gate 601B is connected to the input terminal of the AND gate 600B. A calculation result of the NOR gate 601B is supplied to the AND gate 600B.

An input terminal of the inverter 605 is connected to the interconnect 609C. The output terminal of the inverter 605 is connected to the second input terminal of the AND gate 600C.

The interconnects 609 (609A, 609B and 609C) are connected to a ground line, for example, via switch elements (not shown). Thereby, the states of the interconnects 609A, 609B and 609C can be set at "L" level.

The interconnect (signal line) 609 has a desired interconnect length. Each interconnect 609 has a delay amount due to the length of the interconnect 609. Therefore, the signal that is output to the interconnect 609 propagates with a delay along the interconnect 609 from the output terminal of a certain AND gate 600 to the input terminal of another AND gate 600.

For example, the timing (time instant) when the signal WDA of "H" level is supplied to the input terminal of the AND gate 600B is different from the timing when the signal WDA of "H" level is supplied to the gate of the transistor TRA. The signal WDA of "H" level is supplied to the input terminal of the AND gate 600B with a delay corresponding to the delay amount of the interconnect 609A from the supply of the signal WDA of "H" level to the gate of the transistor TRA (i.e. from the time instant when the transistor TRA is turned on).

The interconnect length of the interconnect 609A, 609B, 609C is so designed as to include a delay amount which secures the desired pulse width W1 of the write voltage VW.

For example, the AND gates 600A, 600B and 600C and OR gates 601A, 601B and 601C include delay amounts corresponding to response times. It is preferable to take into account the delay amounts of these elements, too, as the delay amounts of the interconnects 609. Besides, by controlling the magnitude of the driving voltage (applied voltage) of the AND gate 600, the response speed of the AND gate 600 is varied, and thereby the delay amount added to the signal can be controlled.

(b) Operation Example

Hereinafter, an operation example of the MRAM of the present embodiment will be described. Here, referring to FIG. 9 and FIG. 10, a description is given of the operation of the timing control circuit in the MRAM of this embodiment.

The write enable signal WE is set at "H" level. The interconnects 609A, 609B and 609C are discharged and set at "L" level.

After the potential of the selected word line WLk is set at "H" level, the trigger signal DS of "H" level is supplied to the control unit 60 corresponding to the address ADR, among the plural control units 60 of the timing control circuit 169.

The signal DS of "H" level is supplied to the first input terminal of the AND gate 600A. The output signal of the NOR gate 601A is supplied to the second input terminal of the AND gate 600A.

Here, at a time instant when the potentials of the interconnects 609A, 609B and 609C are "L" level, all of the three signals WDA, WDB and WDC that are supplied to the NOR gate 601A are at "L" level. Therefore, the NOR gate 601A outputs a signal of "H" level to the AND gate 600A.

As a result, by the input of the two "H" level signals, the AND gate 600A outputs the signal WDA of "H" level to the interconnect 609A.

The signal WDA of "H" level is supplied to the gate of the transistor TRA. Thereby, the potential (e.g. 0 V) of the voltage line 900A is supplied to the bit line bBLk by capacitive coupling via the transistor TRA that is in the ON state.

As described above, the interconnect 609 includes the delay amount corresponding to interconnect length. Therefore, the time instant when the potential of the first input terminal of the AND gate 600B is set at "H" level is later than the time instant when the potential of the gate of the transistor TRA is set at "H" level.

As a result, even if the transistor TRA is set in the ON state, the level of the signal, which is supplied from the interconnect 609A to the AND gate 600B and NOR gate 601A, is kept at "L" level until the elapse of a delay period (here, referred to as "delay period TX1") due to the delay amount of the interconnect 609A.

If the delay period TX1 elapsed, the signal of "H" level is supplied to the first input terminal of the AND gate 600B and to the first input terminal of the NOR gate 601A.

The output signal of the NOR gate 601B is supplied to the second input terminal of the AND gate 600B.

The potential of the interconnect 609B is supplied to the first input terminal of the NOR gate 601B. The signal WDC (the potential of interconnect 609C) is supplied to the second input terminal of the NOR gate 601B. When both the two input signals to the NOR gate 601B are at "L" level, the NOR gate 601B supplies the signal of "H" level to the AND gate 600B.

By the input of the two "H" level signals, the AND gate 600B outputs the signal WDB of "H" level to the interconnect 609B.

By the signal WDB of "H" level, the transistor TRB is turned on. Thereby, the voltage value V1 is supplied from the voltage line 900B to the bit line bBLk via the transistor TRB that is in the ON state.

Here, by the elapse of the period TX1, the signal WDA of "H" level is supplied to the NOR gate 601A via the interconnect 609A. Thus, the NOR gate 601A outputs a signal of "L" level to the AND gate 600A.

Thereby, the AND gate 600A outputs the signal WDA of "L" level to the interconnect 609A. By the signal of "L" level, the transistor TRA is turned off, and the voltage line 900A is electrically disconnected from the bit line bBLk. The supply of the voltage from the voltage line 900A to the bit line bBLk is shut off. Incidentally, as described above, by the delay amount of the interconnect 609A, the signal of "L" level is supplied to the AND gate 600B via the interconnect 609A after the elapse of the period TX1.

When a period (here, referred to as "delay period TX2") corresponding to the delay amount of the interconnect 609B has passed since the transistor TRB was turned on, the signal of "H" level is supplied to the first input terminal of the AND gate 600C and to the first input terminal of the NOR gate 601B.

By the input of the "H" level signal WDB, the NOR gate 601B supplies a signal of "L" level to the AND gate 600B. By the signal of "L" level, the AND gate 600B outputs the signal WDB of "L" level.

Thereby, the transistor TRB is turned off, and the voltage line 900B is electrically disconnected from the bit line bBLk.

In this manner, the supply of the voltage value V1 to the selected cell MC is stopped after the elapse of the period TX2 during which the signal WDB of "H" level propagates through the interconnect 609 and reaches the input terminal of the NOR gate 601B from the output terminal of the AND gate 600B.

In the meantime, there is a case in which, in accordance with the delay amounts of the interconnects 609A and 609B, the signal of "L" level from the AND gate 600A (interconnect 609A) is supplied to the AND gate 600B before the NOR gate 601B outputs the signal of "L" level. In this case, by the signal WDA of "L" level from the AND gate 600A, the AND gate 600B outputs the signal WDB of "L" level.

It is preferable, therefore, that the interconnect length of the interconnect 609A and the interconnect length of the interconnect 609B are properly set such that the desired pulse width W1 of the write voltage VW is secured. When the interconnect length of the interconnect 609B is set such that the interconnect 609B includes a delay amount corresponding to the pulse width W1 of the write voltage VW, it is preferable that the interconnect length of the interconnect 609A is greater than the interconnect length of the interconnect 609B.

When the signal WDB of "H" level is supplied to the AND gate 600C and NOR gate 601B, the output signal of the inverter 605 is supplied to the second input terminal of the AND gate 600C. The inverter 605 supplies to the AND gate 600C a signal bWDC having a level opposite to the potential of the interconnect 609C. The potential of the interconnect 609C in the initial state is set at "L" level.

Thus, when the signal of "L" level is supplied to the input terminal of the inverter 605, the inverter 605 supplies the signal bWDC of "H" level to the AND gate 600C.

By the signal WDB of "H" level and the signal bWDC of "H" level from the inverter 605, the AND gate 600C outputs the signal WDC of "H" level to the interconnect 609C.

The signal WDC of "H" level is supplied to the gate of the transistor TRC, and the transistor TRC is turned on.

Thereby, the voltage line 900C is electrically connected to the selected bit line bBLk via the transistor TRC that is in the ON state. The voltage (e.g. 0 V) of the voltage line 900C is supplied to the selected bit line bBLk.

After a period (here, referred to as "delay period TX3") corresponding to the delay amount of the interconnect 609C has passed, the signal WDC of "H" level is supplied to the input terminal of the inverter 605.

By the supply of the signal WDC of "H" level, the inverter 605 supplies the signal bWDC of "L" level to the AND gate 600C.

By the supply of the signal bWDC of "L" level, the AND gate 600C outputs the signal WDC of "L" level to the interconnect 609C.

Thereby, after the elapse of the period TX3, the transistor TRC is turned off. By the transistor TRC that is in the OFF state, the voltage line 900C is electrically disconnected from the selected bit line bBLk. Thereby, the supply of the voltage from the voltage line 900C to the selected bit line bBLk is stopped.

In the meantime, there is a case in which, before the inverter 605 supplies the signal bWDC of "L" level to the AND gate 600C, the signal WDB of "L" level is supplied from the interconnect 609B to the AND gate 600C. In this case, there is a possibility that the AND gate 601C outputs the signal WDC of "L" level by the signal WBD of "L" level.

By making the interconnect length of the interconnect 609C shorter than the interconnect length of the interconnect 609B, the signal from the interconnect 609C is supplied to the AND gate 600C earlier than the signal from the interconnect 609B. Thereby, based on the signal from the interconnect 609C, the transistor TRC is set in the OFF state.

Besides, when the trigger signal DS is at "L" level, the signal of "L" level is supplied to each AND gate 600, and thus the control unit 60 is inactivated. Thereby, the transistors TRA, TRB and TRC are set in the OFF state, and the supply of the write voltage to the memory cell MC is shut off.

As has been described above, in the MRAM of the present embodiment, the timing control circuit 169 of FIG. 9 is used, and the signals are transferred by utilizing the delays of the interconnects 609, and thereby, even if the control signals WDA, WDB and WDC to the transistors TRA, TRB and TRC are not controlled one by one, the supply of the write voltage of the desired pulse shape can automatically be executed by the supply of one trigger signal DS.

(c) Modification

Referring to FIG. 11, a modification of the MRAM of the present embodiment will be described.

FIG. 11 is an equivalent circuit diagram illustrating a modification of the timing control circuit in the MRAM of the present embodiment.

As illustrated in FIG. 11, time adjusting circuits 620 (620A, 620B and 620C) may be connected to the interconnects 609 through which the signals WDA, WDB and WDC propagate.

In the timing control circuit 169, the time adjusting circuits 620A, 620B and 620C are provided on the interconnects 609A, 609B and 609B, respectively. For example, at least one of a buffer, an inverter, an RC delay circuit and a time-digital converter circuit (TDC circuit) is used for the time adjusting circuit 620.

A driving voltage VDLY is supplied to the time adjusting circuit 620. The time adjusting circuit 620 can execute an input/output of a signal at a response speed corresponding to the magnitude of the driving voltage VDLY.

An element (e.g. a transistor) in the time adjusting circuit 620 can vary the response speed of the element/circuit in accordance with the magnitude of the driving voltage VDLY. Therefore, by controlling the magnitude of the driving voltage VDLY, the time adjusting circuit 620 can control a delay amount which is added to the signal.

In this manner, the time adjusting circuit 620 can add a delay amount of a certain degree to a signal from a certain element. The time adjusting circuit 620 outputs the signal, to which the delay amount is added, to some other element as an output signal.

For example, the time adjusting circuit 620 sets the magnitude of the driving voltage VDLY, based on a test step of the MRAM by the test circuit 19, and can control the delay amount which is added to the signal that is transmitted.

Accordingly, even after the manufacture of the chip of the MRAM (at the time of shipment of the chip), the MRAM of this modification can more precisely control the pulse width W1 of the write voltage VW.

(d) Summary

In the resistance change type memory (for example, a magnetic memory such as an MRAM) of the present embodiment, the timing control circuit 169 in the write circuit 16 is used, and the signals are transferred by utilizing the delay amounts of the interconnects 609, and thereby, the plural transistors for supplying the write voltage to the memory cell can automatically be activated/inactivated in a predetermined order, only by the supply of one trigger signal.

In addition, in the resistance change type memory of the present embodiment, the supply period of the voltage from the voltage line to the bit line can be set so as to correspond to the predetermined pulse width of the write voltage, by controlling the delay amounts of the interconnects.

As described above, the resistance change type memory of the second embodiment can improve the operational characteristics of the memory.

(3) Third Embodiment

Referring to FIG. 12 to FIG. 17, a resistance change type memory of a third embodiment will be described.

Here, a more concrete example of the MRAM as the resistance change type memory of this embodiment is described.

(a) Operational Principle

Referring to FIG. 12, the principle of the write operation of the MRAM of the present embodiment will be described.

FIG. 12 is a schematic view for describing the principle of the write operation of the MRAM of this embodiment.

(a) of FIG. 12 is a view for explaining the write voltage which is used in the write operation of the MRAM of the present embodiment. In (a) of FIG. 12, the abscissa axis of the graph corresponds to time, and the ordinate axis of the graph corresponds to the voltage value.

(b) of FIG. 12 is a view for explaining the state of magnetic anisotropy energy in the magnetoresistive effect element at a time of applying the write voltage in the write operation of the MRAM of the present embodiment. In (b) of FIG. 12, the abscissa axis of the graph corresponds to time, and the ordinate axis of the graph corresponds to the magnitude of the magnetic anisotropy energy.

As illustrated in (a) of FIG. 12, in the present embodiment, before and after a voltage value V1 for switching the magnetization of the storage layer is applied to the MTJ element 100, a voltage value V9 having a polarity opposite to the polarity of the voltage value V1 is applied to the MTJ element 100. Here, the voltage value V1 has a positive value, and the voltage value V9 has a negative value.

In the present embodiment, the state in which the positive voltage value V1 is being applied to the MTJ element 100 is a state in which the potential of the reference layer 120 side is higher than the potential of the storage layer 110 side. The state in which the negative voltage value V9 is being applied to the MTJ element 100 is a state in which the potential of the reference layer 120 side is lower than the potential of the storage layer 110 side.

Hereinafter, the application state of the voltage value (positive voltage value) V1 to the MTJ element is referred to as "positive bias state", and the application state of the voltage value (negative voltage value) V9 to the MTJ element is referred to as "negative bias state". In the description below, the write voltage VW is defined as a voltage having such a voltage value as to be able to set the MTJ element in the positive bias state.

As illustrated in (b) of FIG. 12, when the MTJ element is in the negative bias state, the magnetic anisotropy energy of the MTJ element increases from an energy intensity H1 to an energy intensity H9. The magnetic anisotropy energy acts in a perpendicular direction to the plane of the magnetic layer (the interface between the magnetic layer and tunnel barrier layer).

Therefore, in the negative bias state of the MTJ element of the perpendicular magnetization type, the precession movement of magnetization of the storage layer 110 of the MTJ element is suppressed. This suppression of the precession movement of magnetization of the storage layer by the negative bias state of the MTJ element is called "negative bias effect".

In the write operation, the MTJ element is set in the negative bias state before the MTJ element is set in the positive bias state, and thereby, the variance of the initial angle of magnetization of the storage layer can be reduced, and the initial state of magnetization of the storage layer prior to magnetization switching can be stabilized.

Thereby, the MRAM of the present embodiment can start magnetization switching of the storage layer 110 by the application of the voltage value V1, from the state in which the direction (initial angle) of magnetization of the storage layer 110 prior to the application of the voltage value V1 is substantially perpendicular to the plane of the storage layer.

In the write operation, the MTJ element is set in the negative bias state after the MTJ element is set in the positive bias state, and thereby, the precession movement of magnetization of the storage layer 110 after the magnetization switching is stopped.

Thereby, the MRAM of the present embodiment can suppress a fluctuation of the direction (angle) of magnetization of the storage layer 110 after the application of the voltage value V1.

As a result of the above, the MRAM of the present embodiment can improve the reliability of the data write to the memory cell.

Besides, there is a case in which the relationship between the potential of the storage layer side and the potential of the reference layer side for obtaining the negative bias effect of the MTJ element varies depending on the kind and material of the MTJ element.

(b) Circuit Example

Figure 13:
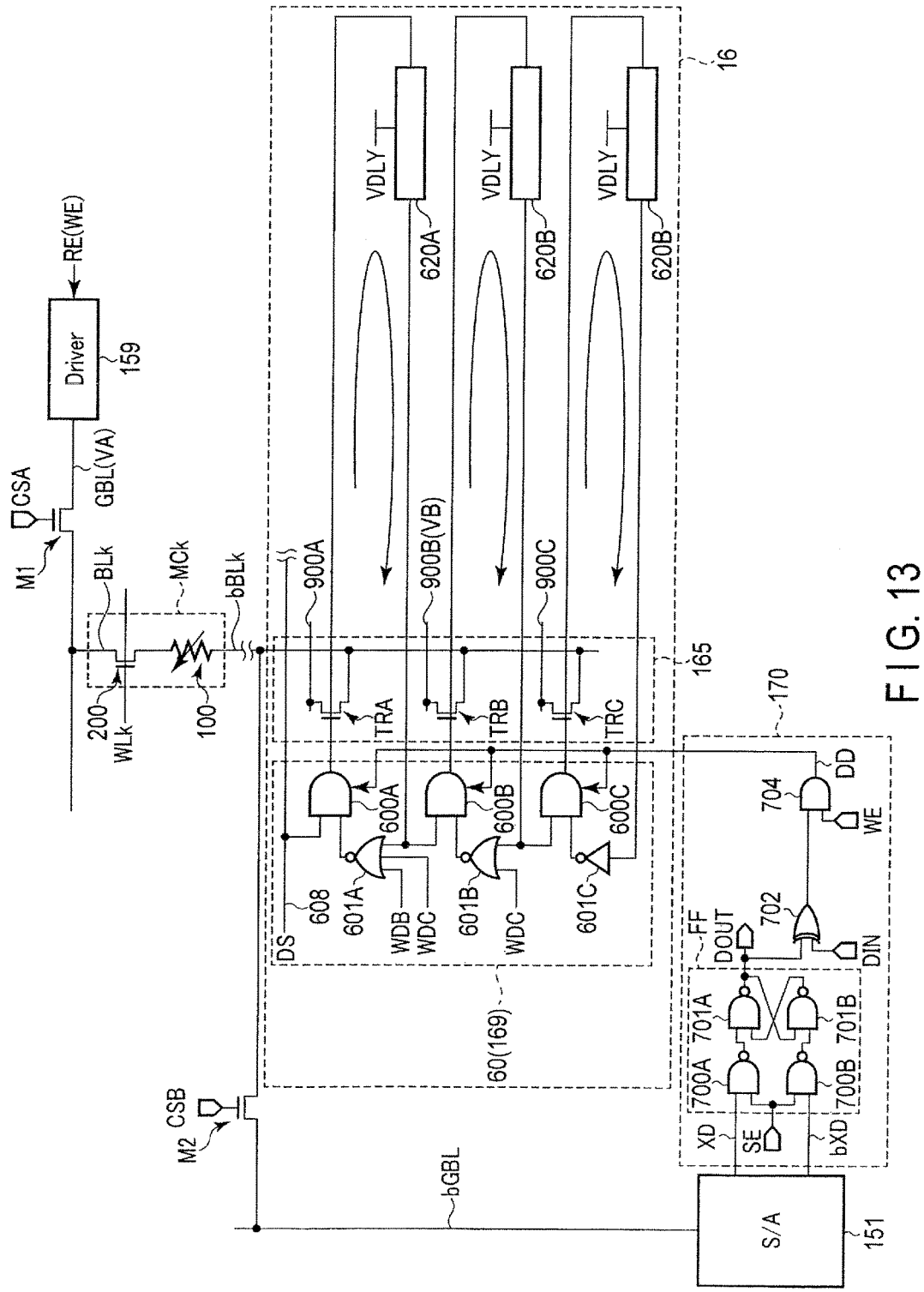
FIG. 13 is a schematic view for describing the resistance change type memory of the third embodiment.

Referring to FIG. 13, a circuit configuration of the MRAM of the present embodiment will be described.

FIG. 13 illustrates, in an extracted and simplified manner, major parts of the structural elements described in the above embodiments.

As illustrated in FIG. 13, the MRAM of this embodiment includes a judgment circuit 170. The judgment circuit 170 is connected to the sense amplifier circuit 151 and write circuit 16.

Using the judgment circuit 170, the MRAM of this embodiment judges whether the data in the selected cell MCk agrees with the data to be written, before and after the write (program) of data to the selected cell MCk. The judgment circuit 170 feeds back the judgment result to the write circuit 16.

At the time of the write operation, the sense amplifier circuit 151 reads the data in the selected cell MCk before and after the program of data.

The judgment circuit 170 judges whether the data that was read from the selected cell MCk agrees with the data that is to be written to the selected cell MCk.

The judgment circuit 170 includes a plurality of NAND gates 700A, 700B, 701A and 701B, an XOR gate 702, and an AND gate 704.

The plural NAND gates 700A, 700B, 701A and 701B are elements in a flip-flop FF. By the NAND gates 700A, 700B, 701A and 701B, the data from the sense amplifier circuit 151 is temporarily stored.

A first input terminal of the NAND gate 700A is connected to a first output terminal of the sense amplifier circuit 151. A first input terminal of the NAND gate 700B is connected to a second output terminal of the sense amplifier circuit 151. A second input terminal of the NAND gate 700A is connected to a second input terminal of the NAND gate 700B.

An output signal XD from the sense amplifier circuit 151 is supplied to the first input terminal of the NAND gate 700A. An output signal bXD from the sense amplifier circuit 151 is supplied to the first input terminal of the NAND gate 700B. A signal SE is supplied to the second input terminals of the NAND gates 700A and 700B. The signals XD and bXD are signals indicative of the read result of data from the selected cell MCk. The signals XD and bXD have a complementary relationship. The signal SE is a sense enable signal. By the sense enable signal SE, the activation and inactivation of the flip-flop FF are controlled.

An output terminal of the NAND gate 700A is connected to a first input terminal of the NAND gate 701A.

An output terminal of the NAND gate 700B is connected to a first input terminal of the NAND gate 701B.

A second input terminal of the NAND gate 701A is connected to an output terminal of the NAND gate 701B. A second input terminal of the NAND gate 701B is connected to an output terminal of the NAND gate 701A.

An output terminal of the NAND gate 701A is connected to a first input terminal of the XOR gate 702. The output terminal of the NAND gate 701A is usable as an output terminal of data from the selected cell. Thereby, the flip-flop FF can output data DOUT which is read from the selected cell.

Data DIN that is to be written to the selected cell MCk is supplied to a second input terminal of the XOR gate 702. Besides, at the time of the judgment process, the data DIN that is supplied to the XOR gate 702 is a 1-bit signal.

An output terminal of the XOR gate 702 is connected to a first input terminal of the AND gate 704.

A calculation result of the XOR gate 702 is supplied to the first input terminal of the AND gate 704.

The write enable signal WE is supplied to a second input terminal of the AND gate 704.

An output terminal of the AND gate 704 is connected to the control unit 60 of the timing control circuit 169. An output signal DD of the AND gate 704 is supplied to control terminals of the plural AND gates 600 of the control unit 60.

The XOR gate 702 outputs "H(1)" when the two input signals are different, and outputs "L(0)" when the two input signals are identical. When the data stored in the selected cell agrees with the write data from the outside, the XOR gate 702 outputs a signal of "L" level.

Therefore, at the time of the write operation, the program of data to the selected cell can be masked for the write enable signal WE of "H" level by the AND gate 704 by the AND operation between the signal (the result of the XOR operation) of "L" level from the XOR gate 702 and the write enable signal WE of "H" level.

The judgment circuit 170 judges whether the signals XD and bXD from the sense amplifier circuit 151 agree with the data DIN. The judgment circuit 170 supplies the signal DD indicative of the judgment result to the timing control circuit 169.

Based on the judgment result (the result of the AND operation), the operation (activation and inactivation) of the control unit 60 of the timing control circuit 169 is determined.

When the data read from the selected cell MCk agrees with the data to be written, the program of data to the selected cell MCk may not be executed. In this case, the control unit 60 is inactivated based on the signal DD from the judgment circuit 170.

Thereby, the supply of the write voltage VW to the selected cell MCk is stopped.

When the data read from the selected cell MCk does not agree with the data to be written, the program of data to the selected cell MCk is executed. In this case, the control unit 60 is activated based on the signal DD from the judgment circuit 170.

Thereby, the control unit 60 supplies the write voltage VW of the predetermined pulse shape to the selected cell MCk.

For example, a driver circuit 159 controls the potential of the bit line BLk at the time of the write operation, in addition to controlling the potential of the bit line BLk at the time of the read operation. However, the driver circuit, which controls the potential of the bit line BLk for the write operation, may be connected to the global bit line GBL (or bit line BLk).

(c) Operation Example

Figure 14:
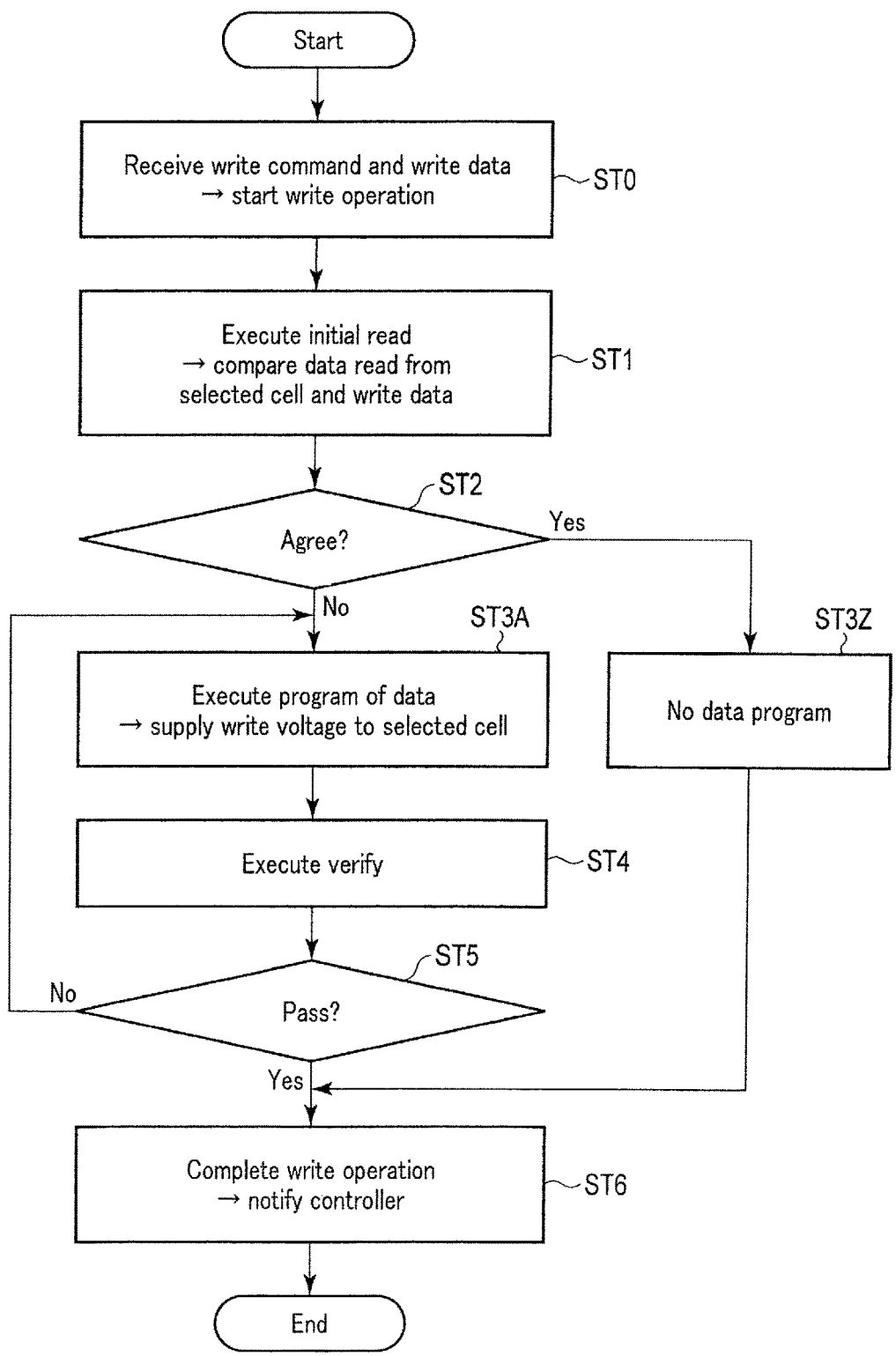
FIG. 14 is a flowchart illustrating an operation example of the resistance change type memory of the third embodiment.
Figure 15:
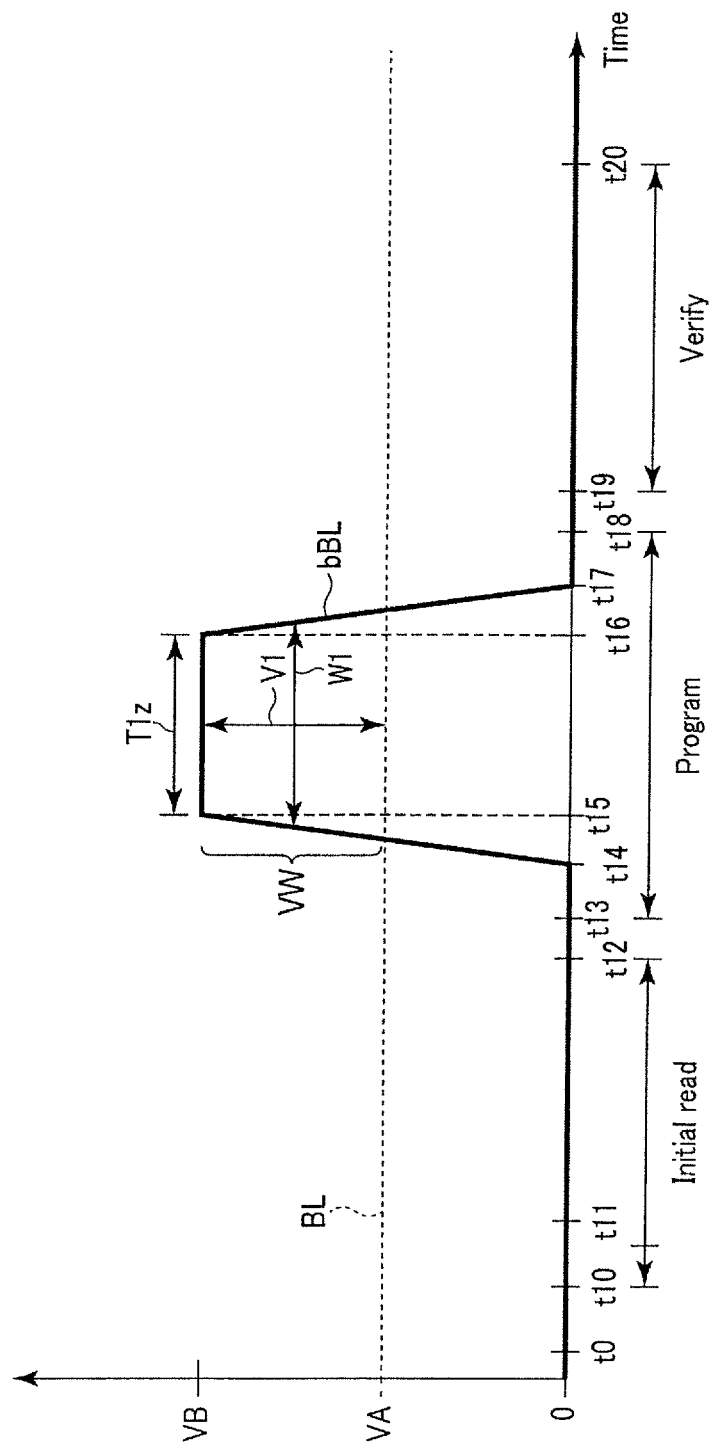
FIG. 15 is a voltage waveform chart illustrating an operation example of the resistance change type memory of the third embodiment.

Referring to FIG. 14 and FIG. 15, an operation example of the MRAM of the present embodiment will be described. Here, also referring to FIG. 1 to FIG. 13 as needed, the operation of the MRAM of the present embodiment will be described.

FIG. 14 is a flowchart for describing the operation example of the MRAM of the present embodiment.

FIG. 15 is a voltage waveform chart for describing the operation example of the MRAM of this embodiment. In FIG. 15, the abscissa axis of the waveform chart corresponds to time, and the ordinate axis of the waveform chart corresponds to the voltage value of the bit line. In FIG. 15, a solid line indicates a voltage (voltage value) which is applied to the bit line bBLk, and a dotted line indicates a voltage (voltage value) which is applied to the bit line BLk.

As illustrated in FIG. 14, the memory controller (or host device) 5 sends the write command CMD, address ADR and write data DT to the MRAM 1 of the present embodiment in response to a request from the outside.

The MRAM 1 of this embodiment receives the write command CMD, address ADR and write data DT (step ST0). Thereby, the MRAM 1 of this embodiment starts the write operation at time instant t0. For example, at the time of the start of the write operation, the control circuit 18 changes the signal level of the write enable signal WE from "L" level to "H" level.

Before executing the program of data, the MRAM 1 of this embodiment executes initial read (also referred to as "advance read") from the selected cell MCk designated by the address ADR (step ST1).

For example, as illustrated in FIG. 15, at the time of the initial read, the control signal CSB corresponding to the select address ADR is set at "H" level. Thereby, the sense amplifier circuit 151 is connected to the selected bit line bBLk via the transistor M2 that is in the ON state.

At time instant t11, the driver circuit 159 applies a voltage value VA to the selected bit line BLk via the transistor M1 that is in the ON state. The potential of the selected bit line bBLk, which is connected to the sense amplifier circuit 151, is set at 0 V. The potential difference between the bit line BLk and bit line bBLk is substantially equal to the voltage value VA. Incidentally, the potential of the bit line BLk may be precharged before the initial read. For example, in order to increase the speed of the operation of the MRAM 1, the voltage value VA may constantly be applied to the bit line BLk (and global bit line GBL). For example, the voltage value VA is set in a range of about 0.8 V to 1.2 V.

Thereby, the read current IR flows through the selected cell MCk from the bit line BLk toward the bit line bBLk.

In accordance with the resistance state of the MTJ element 100 in the selected cell MCk, the magnitude of the read current IR that is output from the selected cell MCk (or the potential of a certain node connected to the selected cell MCk) varies.

At the time of the initial read operation, the sense amplifier circuit 151 and judgment circuit 170 are activated based on the sense enable signal SE from the control circuit 18.

The sense amplifier circuit 151 senses the read current IR (or the potential of the node). The sense amplifier circuit 151 compares the sensed value and the reference value.

Based on the large/small relationship of the sensed value to the reference value, the sense amplifier circuit 151 determines the signal levels of the signals XD and bXD. The signal bXD has a signal level opposite to the signal level of the signal XD. The signal XD corresponds to the data in the selected cell MC.

In the present embodiment, at the time of the initial read of the write operation, the MTJ element 100 is set in the negative bias state.

The MTJ element 100 is set in the negative bias state at the time of the initial read, and thereby the magnetic anisotropy energy of the MTJ element 100 increases, and the precession movement of magnetization of the storage layer 110 is suppressed. Therefore, a fluctuation of the resistance value of the MTJ element 100 due to the precession movement of magnetization is suppressed. Thereby, a fluctuation of the current value of the read current IR is suppressed.

In addition, by the increase of the magnetic anisotropy energy by the setting of the MTJ element 100 in the negative bias state, even if a greater voltage is applied to the MTJ element, magnetization switching of the MTJ element 100 does not easily occur. Therefore, in the present embodiment, a read voltage having a higher voltage value can be applied to the MTJ element 100 that is in the negative bias state.

As a result, the read margin of the MTJ element 100 can be increased.

In this manner, in the state in which the MTJ element 100 is set in the negative bias state, the initial read is executed, and thereby the current value of the read current (or the potential of the node) can be sensed with higher precision.

Accordingly, the initial read in the write operation can be executed with high reliability.

Besides, like the initial read at the time of the write operation, in the read operation of the MRAM of this embodiment, the MTJ element 100 may be set in the negative bias state and the read of data of the selected cell may be executed. Thereby, in the read operation of the MRAM of the present embodiment, the MRAM of this embodiment can obtain the same advantageous effects as in the initial read for the MTJ element that is in the negative bias state.

The sense amplifier circuit 151 supplies the signals XD and bXD to the judgment circuit 170.

The signals XD and bXD from the sense amplifier circuit 151 are temporarily held by the flip-flop FF.

Based on the result of the calculation process of the judgment circuit 170, it is judged whether the write data DIN and the data XD read from the selected cell agree or not (step ST2).

In the judgment circuit 170, the signal XD is supplied to the first input terminal of the NAND gate 700A, and the signal bXD is supplied to the first input terminal of the NAND gate 700B.

The sense enable signal SE of "H" level is supplied to the NAND gates 700A and 700B. Therefore, the NAND gates 700A and 700B output inverted signals of the input signals XD and bXD to the NAND gates 701A and 7001B, respectively. The NAND gate 700A supplies the inverted signal of the signal XD to the NAND gates 701A, and the NAND gate 700B supplies the inverted signal of the signal bXD to the NAND gates 701B.

The NAND gate 701A outputs an inverted signal of the output signal of the NAND gates 700A. The NAND gate 701A outputs the signal of the same signal level as the signal XD.

The output signal of the NAND gate 701A is supplied to the XOR gate 702 as data that was read from the selected cell MCk.

The XOR gate 702 executes an XOR operation by using the signal from the NAND gate 701A and the data DIN. The data DIN, which is supplied to the XOR gate 702, is a 1-bit signal which is to be written to the selected cell MCk.

When the signal level of the signal from the NAND gate 701A (the data in the selected cell) and the signal level of the write data DIN are equal, the XOR gate 702 outputs a signal of "L" level.

When the signal level of the signal from the NAND gate 701A and the signal level of the write data DIN are different, the XOR gate 702 outputs a signal of "H" level.

The XOR gate 702 supplies a signal based on the result of the XOR operation to the AND gate 704.

The AND gate 704 executes an AND operation using the write enable signal WE and the signal from the XOR gate 702 (the result of the XOR operation). At the time of the write operation, the write enable signal WE is set at "H" level. Therefore, the signal level of the output signal DD of the AND gate 704 is determined by the output signal from the XOR gate 702.

In this manner, the judgment circuit 170 compares the write data DIN and the data XD that was read from the selected cell MCk. The comparison result is output from the judgment circuit 170 to the write circuit 16 as the signal of "H" level or "L" level.

Besides, when the signal level of the write enable signal WE is set at "L" level (when the operation to be executed is not the write operation), the AND gate 704 outputs a signal of "L" level. By the signal of "L" level of the AND gate 704, the timing control circuit 169 is inactivated.

After the calculation process of the judgment circuit 170 is completed, the sense enable signal SE is set at "L" level. Thereby, the sense amplifier circuit 151 is inactivated. The signal level of the control signal CSB is transitioned from "H" level to "L" level. Thereby, the sense amplifier circuit 151 is electrically disconnected from the selected bit line bBLk by the transistor M2 that is in the OFF state.

Thereby, at time instant t12, the initial read ends.

The output signal DD of the AND gate 704 indicates a judgment result of the presence/absence of data program by the judgment circuit 170.

When the data XD in the selected cell MCk and the write data DIN agree (Yes in step ST2), the signal of "L" level is output from the XOR gate 702 to the AND gate 704. As regards the output signal from the AND gate 704 at the time of the write operation, the signal of "L" level indicates that program of data to the selected cell MCk is not executed.

When the data XD in the selected cell MCk and the write data DIN does not agree (No in step ST2), the signal of "H" level is output from the XOR gate 702 to the AND gate 704. As regards the output signal from the AND gate 704 at the time of the write operation, the signal of "H" level indicates that program of data to the selected cell MCk is executed.

When the write data and the data read from the selected cell MCk agree (when the output signal of the AND gate 704 is at "L" level), the program of data is not executed to the selected cell MCk (step ST3Z).

In this case, the signal DD of "L" level from the AND gate 704 is supplied to the control terminals of the AND gates 600 of the control unit 60. The AND gates 600 are inactivated by the signal DD of "L" level.

As a result, in the write circuit 16, the equalizer circuit 165 is inactivated. For example, even if the trigger signal DS is being supplied to the equalizer circuit 165, the AND gate 600 is in the inactive state, and thus the equalizer circuit 165 does not operate.

In this manner, when the write data agrees with the data read from the selected cell, the write operation is terminated without forming the write voltage VW by the equalizer circuit 165.

When the write data does not agree with the data read from the selected cell MCk (when the output signal of the AND gate 704 is at "H" level), the program of data to the selected cell MCk is executed (step ST3A).

In this case, the signal DD of "H" level from the AND gate 704 is supplied to the control terminals of the AND gates 600 of the control unit 60. The AND gates 600 are activated by the signal DD of "H" level.

In the equalizer circuit 165, the trigger signal DS is supplied to the control unit 60 which corresponds to the address ADR.

Thereby, the control unit 60 starts the operation. The control unit 60 controls the connection between the bit line bBLk and voltage lines 900, substantially in the same manner as in the example described with reference to FIG. 6, FIG. 9, FIG. 10 and FIG. 11.

In parallel with the operation of the control unit 60, the driver circuit 159 applies a desired voltage to the bit line BLk.

The driver circuit 159 keeps the potential of the selected bit line BLk at the voltage value VA, from the period for initial read (hereinafter referred to as "initial read period") to the period for program (hereinafter "program period"). In the program period, the potential of the selected bit line BLk is set at the voltage value VA.

As illustrated in FIG. 15, the program of data to the selected cell MCk is started, for example, at time instant t13.

The equalizer circuit 165 sets the transistor TRA in the ON state by the control by the control unit 60. Thereby, a voltage of 0 V is applied to the bit line bBLk via the transistor TRA that is in the ON state.

In this case, the potential of the bit line BLk on the driver circuit 159 side is higher than the potential of the bit line bBLk on the equalizer circuit 165 side, and thus, the MTJ element 100 of FIG. 2 is set in the negative bias state.

Since the MTJ element 100 is in the negative bias state, the precession movement of magnetization of the storage layer 110 is suppressed, and the initial angle of magnetization of the storage layer 110 is fixed. Thereby, the MRAM of this embodiment can induce magnetization switching of the storage layer 110 from the state in which the fluctuation of the initial angle of magnetization of the storage layer 110 is suppressed.

After a delay period corresponding to the interconnect length of the interconnect of the control unit 60 has passed, the equalizer circuit 165 sets, at time instant t14, the transistor TRA in the OFF state and sets the transistor TRB in the ON state by the control by the control unit 60. Thereby, the voltage (voltage value VB) of the voltage line 900B is supplied to the bit line BLk via the transistor TRB that is in the ON state.

By the transfer of the voltage to the bit line bBLk by the equalizer circuit 165, the potential of the bit line bBLk increases. If the potential of the bit line bBLk rises to the voltage value VA or more, the negative bias state of the MTJ element 100 is released.

At time instant t15, the potential of the bit line bBLk reaches the voltage value VB. In a period T1z from time instant t15 to time instant t16, the potential of the bit line bBLk is kept at the voltage value VB.

In the period T1z in which the potential of the bit line bBLk is set at the voltage value VB, the potential of the bit line BLk on the driver circuit 159 side is lower than the potential of the bit line bBLk on the equalizer circuit 165 side. Thus, the MTJ element 100 is set in the positive bias state.

The voltage values VB and VA of the bit lines BLk and bBLk are set, respectively, such that the magnitude of magnetic anisotropy energy in the MTJ element 100 becomes substantially zero.

Therefore, a voltage value V1 (=VB−VA) corresponding to the potential difference between the bit line bBLk and bit line BLk is applied to the MTJ element 100. Thereby, the precession movement of the storage layer 110 is induced. For example, the voltage value VB is set at a value in the range of about 1.8 V to 2.7 V in accordance with the value of the voltage VA.

After a delay period corresponding to the interconnect length of the interconnect 609B of the control unit 60 has passed, the transistor TRB is turned off at time instant t16 by the control by the control unit 60. Thereby, the bit line bBLk is electrically disconnected from the voltage line 900B by the transistor TRB that is in the OFF state.

The period T1z from time instant t15 to time instant t16 (or the full-width at half-maximum W1 in the voltage pulse of voltage value VA or more) at the time of application of the write voltage VW is so set as to correspond to the period until the direction of magnetization of the storage layer 110 is reversed from the initial state to the opposite direction. The delay amount of the interconnect 609B, in which the signal WDB propagates, is set by the control of the interconnect length of the interconnect 609B (and the time adjusting circuit 620) such that this period T1z can be secured.

In this manner, the direction of magnetization of the storage layer 110 is reversed by the voltage value V1 (=VB−VA) being applied in the period T1z to the MTJ element 100 in the selected cell MCk from the equalizer circuit 165.

In interlock with the OFF of the transistor TRB, the transistor TRC is set in the ON state. The voltage 900C is electrically connected to the bit line bBLk via the transistor TRC that is in the ON state. Thereby, the voltage of 0 V is supplied from the voltage line 900C to the bit line bBLk, and the potential of the bit line bBLk decreases.

If the potential of the bit line bBLk becomes lower than the potential (voltage value VA) of the bit line BLk, the application state of the voltage to the MTJ element changes to the negative bias state.

By the MTJ element 100 being set in the negative bias state, the precession movement of magnetization of the storage layer 110 is suppressed. Thereby, in the present embodiment, in the MTJ element 100, a shift of the angle of the switched magnetization in the storage layer 110 can be suppressed.

At time instant t17, the potential of the bit line bBLk is set at 0 V.

At time instant t18, the program of data to the selected cell MCk is completed.

As described above, in the MRAM of the present embodiment, the connection between the voltage line 900 and bit line bBLk by the equalizer circuit 165 is controlled. Thereby, in this embodiment, the write voltage VW having the predetermined pulse shape (e.g. pulse width) is applied to the selected cell MCk.

After the program of data, the MRAM 1 of the present embodiment executes verify (program verify) for the selected cell (step ST4).

By the program verify, pass/failure of program of data to the selected cell MCk is judged (step ST5). For example, in the program verify, by an operation similar to the initial read, it is judged whether the data DIN to be written and the data in the selected cell MCk after the program agree or not.

For example, at time instant t19, the program verify is started. A voltage of 0 V is applied to the bit line bBLk, and a voltage value VA is applied to the bit line BLk. Thereby, the read current IR from the selected cell MCk (or the potential of a certain node of the selected cell) is sensed. The data of the selected cell MCk after the program is read.

The judgment circuit 170 judges whether the data DIN to be written and the data in the selected cell MCk after the program agree or not.

At time instant t20, the judgment process in the judgment circuit 170 is completed, and the program verify ends.

When the data DIN to be written and the data in the selected cell MCk after the program do not agree, it is judged that the program is "fail".

When the program is "fail", the application of the write voltage VW by the equalizer circuit 165 in the above step ST3A is executed once again.

For example, until the result of the program verify is judged to be "pass", the program (step ST3A) and verify (step ST4) are repeatedly executed. However, if the result of the program verify is not judged to be "pass" even when the number of times of program has reached a set value, a program error may be judged. In this case, the MRAM 1 may notify the memory controller (or host device) 5 that the write operation based on the write command of this time is "error", or the data to be written may be written to a memory cell of another address that was generated in the MRAM on the basis of an address from the outside. In addition, in this case, the write operation may be terminated without a judgement of a program error or a notification to the memory controller 5.

When the data DIN to be written and the data in the selected cell MCk after the program agree, it is judged that the program is "pass".

In this case, the MRAM 1 of the present embodiment completes the write operation (step ST6). For example, the MRAM 1 of this embodiment notifies the memory controller 5 of the completion of the write operation.

In the above-described manner, the write operation of the MRAM of the present embodiment is finished.

(c) Modifications

Figure 16:
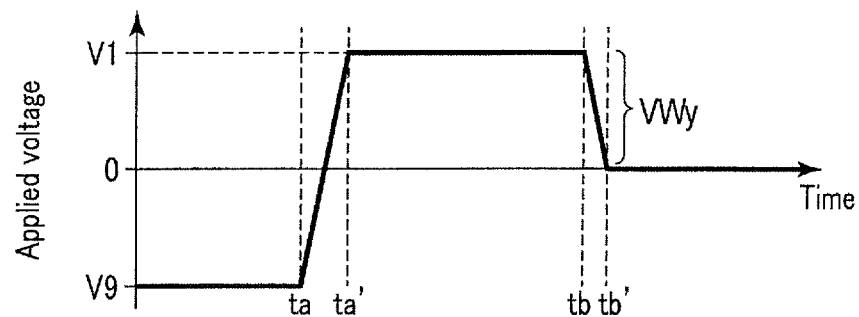
FIG. 16 is a voltage waveform chart illustrating a modification of the resistance change type memory of the third embodiment.
Figure 17:
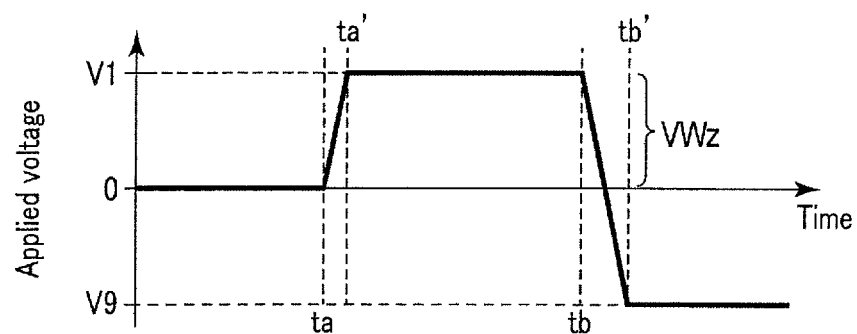
FIG. 17 is a voltage waveform chart illustrating a modification of the resistance change type memory of the third embodiment.

Referring to FIG. 16 and FIG. 17, modifications of the MRAM of the present embodiment will be described.

FIG. 16 and FIG. 17 are waveform charts showing pulse waveforms of the write voltage in the modifications of the MRAM of the present embodiment. In FIG. 16 and FIG. 17, the abscissa axis of the graph corresponds to time, and the ordinate axis of the graph corresponds to the voltage value of the voltage that is applied to the MTJ element.

In the example illustrated in FIG. 15, the write voltage VW is applied to the MTJ element such that the MTJ element is set in the negative bias state before and after the MTJ element is set in the positive bias state.

However, the MTJ element may be set in the negative bias state, only before or after the MTJ element is set in the positive bias state.

In a write voltage VWy in the example illustrated in FIG. 16, the application of a positive voltage value V1 to the MTJ element 100 is started at time instant ta. At time instant ta', the write voltage VWy reaches the voltage value V1.

Before the MTJ element 100 is set in the positive bias state by the application of the voltage value V1, a negative voltage value is applied to the MTJ element 100.

Thereby, in the example of FIG. 16, before the voltage value V1 is applied; the MTJ element 100 is set in the negative bias state in order to suppress a fluctuation of the initial angle of magnetization of the storage layer.

At time instant tb, the stop of supply of the voltage value V1 is started, and at time instant tb', the stop of supply of the voltage value V1 is finished. At time instant tb', the voltage of 0 V is applied to the MTJ element 100. Therefore, after time instant tb', the MTJ element 100 is not set in the negative bias state.

In a write voltage VWz in the example illustrated in FIG. 17, a voltage of 0 V is applied to the MTJ element 100 before a time instant ta at which the supply of the voltage V1 is started. Therefore, the MTJ element 100 is not set in the negative bias state in the period before the supply of the voltage V1.

At time instant tb, the stop of supply of the voltage value V1 is started. At time instant tb', if the applied voltage to the MTJ element 100 decreases below 0 V, the MTJ element 100 is set in the negative bias state.

Thereby, in the example illustrated in FIG. 17, the precession movement of magnetization after the magnetization switching of the storage layer is suppressed.

Even when the write operation is executed by the write voltages VWy and VWx as shown in FIG. 16 and FIG. 17, the MRAM of this embodiment can obtain the above-described advantageous effects.

This control of the bias state in the MTJ element 100 can be executed by changing the voltage that is applied to the voltage line 900.

For example, when the write voltage VWy shown in FIG. 16 is applied to the MTJ element 100, the voltage value that is applied to the voltage line 900C should be set to the voltage value VA that is equal to the voltage applied to the bit line BLk.

For example, when the write voltage VWz shown in FIG. 17 is applied to the MTJ element 100, the voltage value that is applied to the voltage line 900A should be set to the voltage value VA that is equal to the voltage applied to the bit line BLk.

In this manner, in the MRAM 1 of this embodiment, the pulse shape of the write voltage can be varied by controlling the magnitude of the voltage applied to the voltage line 900.

The MRAM 1 of this embodiment can control the pulse shape of the write voltage without making a great change to the circuit configuration.

(d) Summary

As described above, in the magnetic memory as the resistance change type memory of the present embodiment, the write voltage of the predetermined pulse shape can be supplied to the selected cell by the equalizer circuit in the operation sequence based on the write command from the outside.

In the magnetic memory of the present embodiment, by controlling the voltage applied to the voltage line, the MTJ element can be set in the negative bias state before and after the period for magnetization switching of the storage layer.

As a result, the magnetic memory of this embodiment can enhance the reliability of the program of data to the selected cell.

In addition, the magnetic memory of this embodiment can enhance the efficiency of the operation and the reliability of the data in the memory by the initial read prior to the program of data and by the verify after the program of data.

Therefore, the magnetic memory as the resistance change type memory of the present embodiment can improve the operational characteristics.

(4) Fourth Embodiment

Referring to FIG. 18, a resistance change type memory of a fourth embodiment will be described.

FIG. 18 is an equivalent circuit diagram illustrating an example of the internal configuration of the write circuit in the resistance change type memory (e.g. MRAM) of the present embodiment.

As illustrated in FIG. 18, in the equalizer circuit 165 of the MRAM of the present embodiment, back biases are applied to the transistors TRA, TRB and TRC.

In the transistor TRA, the back gate (a well in the semiconductor substrate in which the transistor is provided) is connected to the voltage line 900A.

In the transistor TRB, the back gate is connected to the bit line bBL.

In the transistor TRC, the back gate is connected to the voltage line 900C.

The voltage of 0 V is applied to the voltage lines 900A and 900C. Therefore, the voltage of 0 V is applied to the back gates of the transistors TRA and TRC.

As described above, the transistors TRA, TRB and TRC are N-type field-effect transistors.

In the N-type transistor, the capability for transferring a positive voltage is lower than the capability for transferring a voltage of 0 V (or a negative voltage).

Therefore, in the transistor such as the transistor TRB for transferring the positive voltage value V1 (or positive voltage value VB) to the bit line bBL, it is preferable that the back gate is connected not to the voltage line 900B to which the positive voltage value is applied, but to the bit line bBL. In this case, in the transistor TRB, the potential of the back gate is set to be equal to the potential of the bit line bBL.

Therefore, as in the present embodiment, the back gate of the N-type transistor TRB, which transfers the positive voltage value V1 to the bit line bBL, is connected to that terminal of the transistor TRB, which is connected to the bit line bBL. Thereby, in the MRAM of the present embodiment, the flow of electric current in the transistor TRB becomes easier.

Thereby, in the MRAM of this embodiment, even if the N-type transistor is used for transferring the positive voltage, the degradation of the voltage supplied from the voltage line to the bit line can be suppressed.

Therefore, the resistance change type memory of the present embodiment can improve the operational characteristics.

(5) Fifth Embodiment

Figure 19:
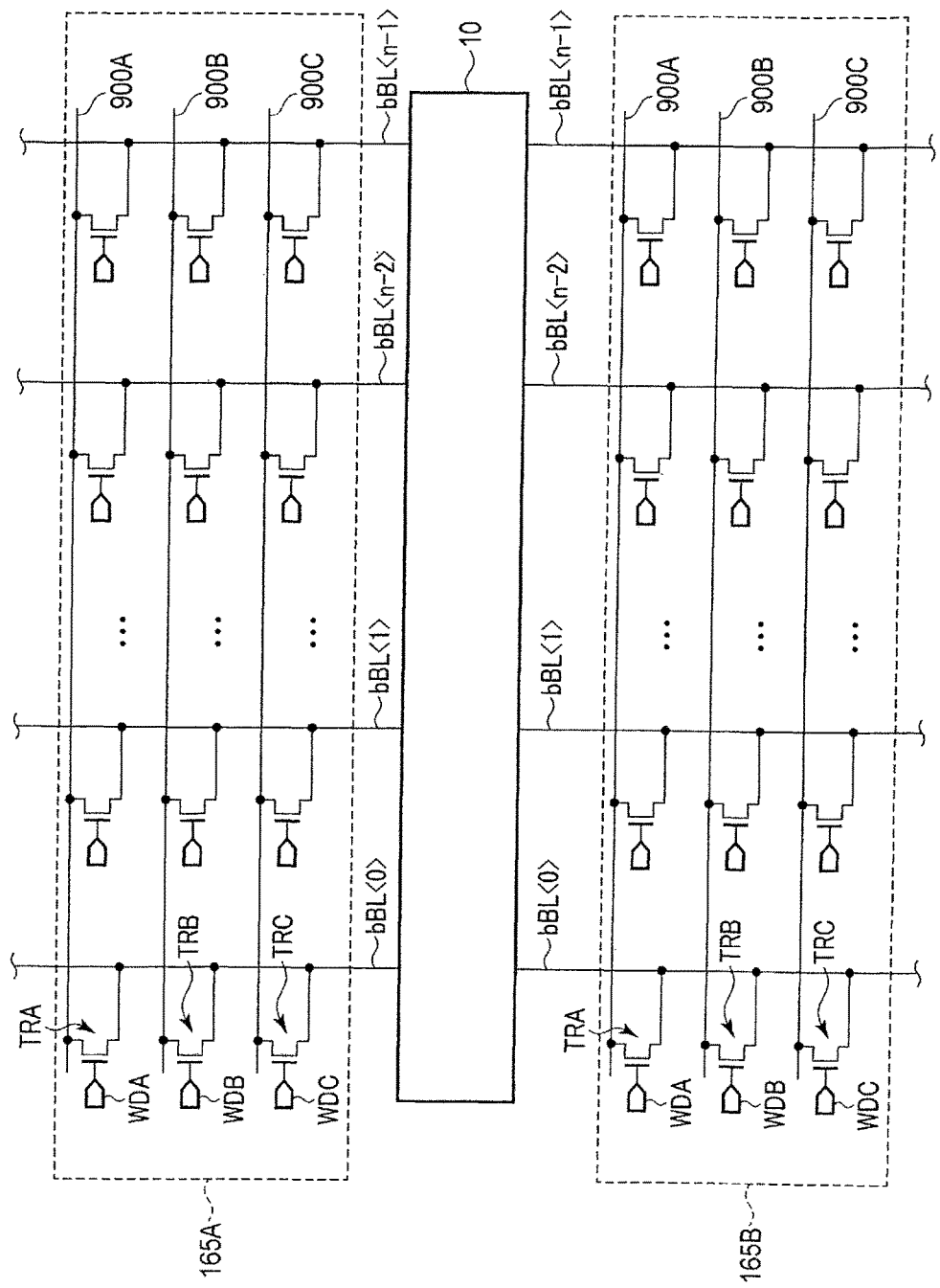
FIG. 19 is a schematic view illustrating a configuration example of a resistance change type memory of a fifth embodiment.

Referring to FIG. 19 and FIG. 20, a resistance change type memory of a fifth embodiment will be described.

FIG. 19 and FIG. 20 are schematic views for describing layouts of the equalizer circuit in the resistance change type memory (e.g. MRAM) of the present embodiment.

As illustrated in FIG. 19, equalizer circuits 165A and 165B may be provided at both ends of the memory cell array 10. The memory cell array 10 is provided between the two equalizer circuits 165A and 165B.

At the time of the write operation, one of the two equalizer circuits 165A and 165B is selected based on coordinates (e.g. row address) of the selected cell MCk in the memory cell array 10. The selected one of the equalizer circuits 165A and 165B supplies the write voltage VW to the selected cell MCk.

As illustrated in FIG. 20, the memory cell array 10 includes two areas MX1 and MX2. A plurality of memory cells MC are arranged in an array in each of the areas (hereinafter, also referred to as "sub-arrays") MX1 and MX2. The areas MX are areas into which the memory cell array 10 is divided in a direction crossing the direction of extension of word lines (e.g. the direction of extension of bit lines).

The equalizer circuit 165 is provided between the two sub-arrays MX1 and MX2. For example, the equalizer circuit 165 is shared by the two sub-arrays MX1 and MX2.

Besides, as in the example of FIG. 19, equalizer circuits may be provided at both ends of the sub-arrays MX1 and MX2 such that the sub-arrays MX1 and MX2 are interposed between the two equalizer circuits.

In the meantime, the equalizer circuit 165 may be provided for the bit lines BL.

When the equalizer circuit is provided only on one end side of the memory cell array, the distance between the memory cell on the other end side of the memory cell array, among the plural memory cells in the memory cell array, and the equalizer circuit is greater than the distance between the memory cell on the one end side of the memory cell array and the equalizer circuit.

There is a possibility that, due to such a difference in distance between the memory cells and the equalizer circuit, there occurs an operational defect (e.g. program error) resulting from attenuation of the write voltage (distortion of the pulse shape) by the interconnect resistance and interconnect capacitance depending on coordinates of a memory cell in the memory cell array.

In the present embodiment, the equalizer circuits 165A, 165B and 165C are disposed at both ends of the memory cell array, or disposed between the two areas MX1 and MX2 which are set in the memory cell array 10.

Thereby, in the MRAM of this embodiment, the difference in distance between the memory cells and equalizer circuit is reduced by the layout of the equalizer circuit in relation to the memory cell array.

As a result, at the time of the write operation, the MRAM of the present embodiment can reduce operational defects of memory cells due to the distance between the memory cells and the equalizer circuit.

As described above, the resistance change type memory of the present embodiment can improve the operational characteristics of the memory.

(6) Sixth Embodiment

Figure 23:
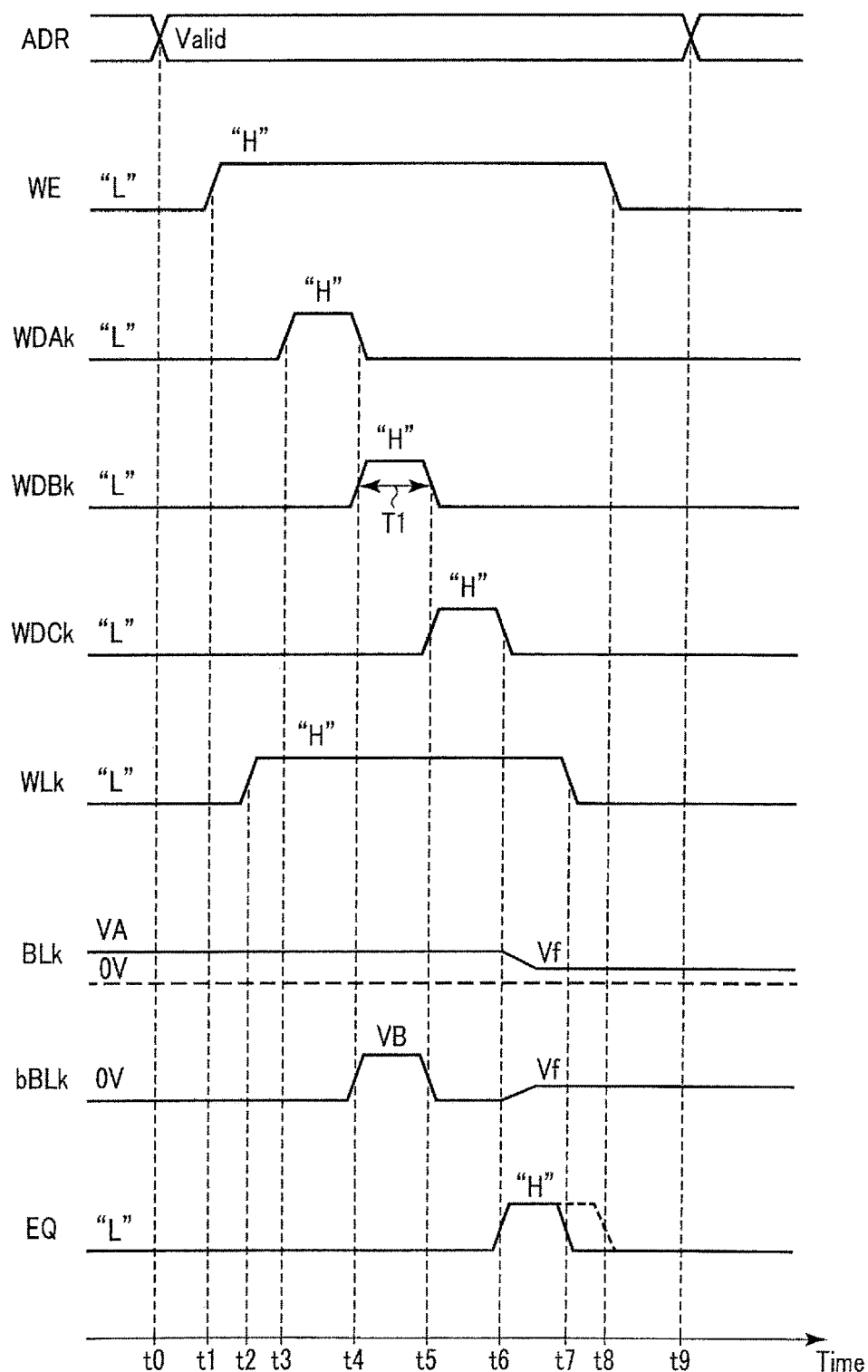
FIG. 23 is a timing chart illustrating an operation example of the resistance change type memory of the sixth embodiment.

Referring to FIG. 21, FIG. 22 and FIG. 23, a resistance change type memory of a sixth embodiment will be described.

(a) Basic Example

Referring to FIG. 21, a basic example of the resistance change type memory (e.g. MRAM) of the present embodiment will be described.

FIG. 21 is a voltage waveform chart of a voltage which is applied to the MTJ element at the time of the write operation of the MRAM of the present embodiment.

As illustrated in FIG. 21, after the write voltage VW is applied to the MTJ element 100, the MTJ element 100 is set in the negative bias state.

In this embodiment, the MTJ element 100 in which data is programmed is set in the state in which 0 V is applied, after the negative bias state. Hereinafter, the state in which 0 V is applied to the MTJ element 100 is referred to as "zero bias state".

For example, a period TC during which the MTJ element changes from the negative bias state to zero bias state is longer than a period TA during which the MTJ element changes from the negative bias state to positive bias state (or a period TB during which the MTJ element changes from the positive bias state to negative bias state).

The period TC from the start of rising of the voltage at time instant tc to the end of rising of the voltage at time instant tc' is longer than the period TA from the start of rising of the voltage at time instant ta to the end of rising of the voltage at time instant ta'.

When the MTJ element transitions from the negative bias state to the zero bias state in the same period as the period (speed) of rising (falling) of the write voltage VW, an excess precession movement occurs in the magnetization of the storage layer. Thereby, the resistance value of the MTJ element varies, and there is a possibility that an error occurs in the data in the memory cell.

In this case, it is possible that an error occurrence ratio in the data in the memory cell array increases, and the reliability of the data lowers.

In the present embodiment, the MTJ element is transitioned from the negative bias state to zero bias state in a period which is longer than the period of rising of the write voltage VW. Thereby, an excess precession movement of the magnetization of the storage layer can be suppressed.

As a result, the MRAM of the present embodiment can suppress an increase of the error occurrence ratio of the data, and can maintain the reliability of the data.

(b) Concrete Example

Referring to FIG. 22 and FIG. 23, a concrete example of the MRAM of the present embodiment will be described.

FIG. 22 is an equivalent circuit diagram illustrating a circuit configuration of the MRAM of the present embodiment.

As illustrated in FIG. 22, the MRAM of this embodiment includes a second equalizer circuit 163.

The equalizer circuit 163 includes a plurality of transistors TRX (TRX<0>, TRX<1>, . . . , TRX<n-2>, TRX<n-1>). Each transistor TRX is connected between the bit lines BL and bBL. One transistor TRX corresponds to one bit line pair (BL, bBL).

The transistor TRX is connected between the bit lines BL and bBL in parallel with the memory cell MC.

One end of the current path of the transistor TRX is connected to the bit line BL, and the other end of the current path of the transistor TRX is connected to the bit line bBL.

The gates of the plural transistors TRX are connected to a common interconnect (signal line) 899. A signal EQ of "H" level or "L" level is supplied to the interconnect 899.

The ON/OFF of the plural transistors TRX is controlled by the signal level of the signal EQ.

The signal level of the signal EQ is controlled by the control circuit 18. However, the signal level of the signal EQ may be controlled by the column control circuit 14B or control unit 60.

When the transistor TRX is in the OFF state, the two bit lines BL and bBL are connected or disconnected in accordance with the selected/unselected state of the memory cell MC, without intervention of the transistor TRX.

When the transistor TRX is in the ON state, the two bit lines BL and bBL are electrically connected via the transistor TRX that is in the ON state. By the transistor TRX that is in the ON state, the bit lines BL and bBL are short-circuited, and a current flows between the bit lines BL and bBL. By the flow of this current, the bit lines BL and bBL are slowly charged, and are set to substantially the same potential. As a result, by the transistor TRX that is in the ON state, the potential difference between the bit lines BL and bBL is set to substantially zero.

FIG. 23 is a timing chart illustrating an operation example of the MRAM of the present embodiment.

As illustrated in FIG. 23, the signal EQ is set at "L" level during the period in which the write voltage VW is being supplied to the selected cell MCk via the first equalizer circuit 165.

As described above, the signal levels of the signals WDAk, WDBk and WDCk are sequentially transitioned from "H" level to "L" level. During the period in which the signal level of the signal WDCk is set at "H" level, the MTJ element 100 in the selected cell MCk is set in the negative bias state.

After the signal WDCk is set at "L" level, the control circuit 18 changes, at a certain time instant (e.g. time instant t6), the signal level of the signal EQ from "L" level to "H" level. After the transistors TRA, TRB and TRC are set in the OFF state, the transistor TRX is turned on by the signal EQ of "H" level.

Thereby, a current flows between the bit line BL and bit line bBL via the transistor TRX that is in the ON state. By the flow of this current, the bit lines BL and bBL are relatively slowly charged, and are set to substantially the same potential Vf. The potential (voltage value) Vf is lower than the voltage VA, and may be 0 V in some cases.

As a result, the potential difference between the bit lines BL and bBL becomes substantially zero, and the MTJ element 100 is set in the zero bias state.

In the present embodiment, after the signal WDCk is set at "L" level, the electric connection (conduction state) between the bit lines BL and bBL by the transistor TRX is continued during the period (from time instant t6 to time instant t7) until the potential of the selected word line WLk changes from "H" level to "L" level. The period during which the electrical connection between the bit lines BL and bBL is continued is set to be a sufficiently long period (e.g. several nanoseconds), and thereby the bit lines BL and bBL are relatively slowly charged and discharged and are set to substantially the same potential. As a result, in the MRAM of this embodiment, the potential difference between the bit lines BL and bBL can be more exactly decreased and stabilized.

At time instant t7, the control circuit 18 changes the signal level of the signal EQ from "H" level to "L" level. Thereby, the transistor TRX is set in the OFF state. The electric connection (condition state) between the bit lines BL and bBL by the transistor TRX is released.

Besides, as indicated by a dotted line in FIG. 23, the signal EQ may be set at "L" level at a timing (e.g. time instant t8) after the potential of the selected word line WLk is set to "L" level from "H" level. The signal EQ may be set at "H" level at a timing (e.g. time instant t7) when the potential of the selected word line WLk is set to "L" level from "H" level.

Thereafter, the write enable signal WE is set at "L" level, and the address ADR is invalidated.

Besides, in the MRAM of this embodiment, for example, the respective elements M1, TRA, TRB and TRC are set in the OFF state, and the supply of voltages from the drivers 159 (150) and 160 and equalizer circuit 165 to the bit lines BL and bBL is stopped. Thereby, in the MRAM of this embodiment, the potential of the bit line BL, bBL can be set to 0 V ultimately or before the start of the next write operation.

Thereby, the write operation of the MRAM of the present embodiment is completed.

As described above, in the MRAM of this embodiment, after the MTJ element in which magnetization is switched is set in the negative bias state, the MTJ element is set in the zero bias state. In the MRAM of this embodiment, the state of the MTJ element transitions from the negative bias state to zero bias state in the period that is longer than the period of rising of the write voltage VW.

Thereby, the MRAM of this embodiment can suppress an excess precession movement of the magnetization of the storage layer.

As a result, the MRAM of the present embodiment can suppress an increase of the error occurrence ratio of the data, and can improve the reliability of the data.

As described above, the resistance change type memory of the present embodiment can improve the operational characteristics of the memory.

(7) Seventh Embodiment

Figure 25:
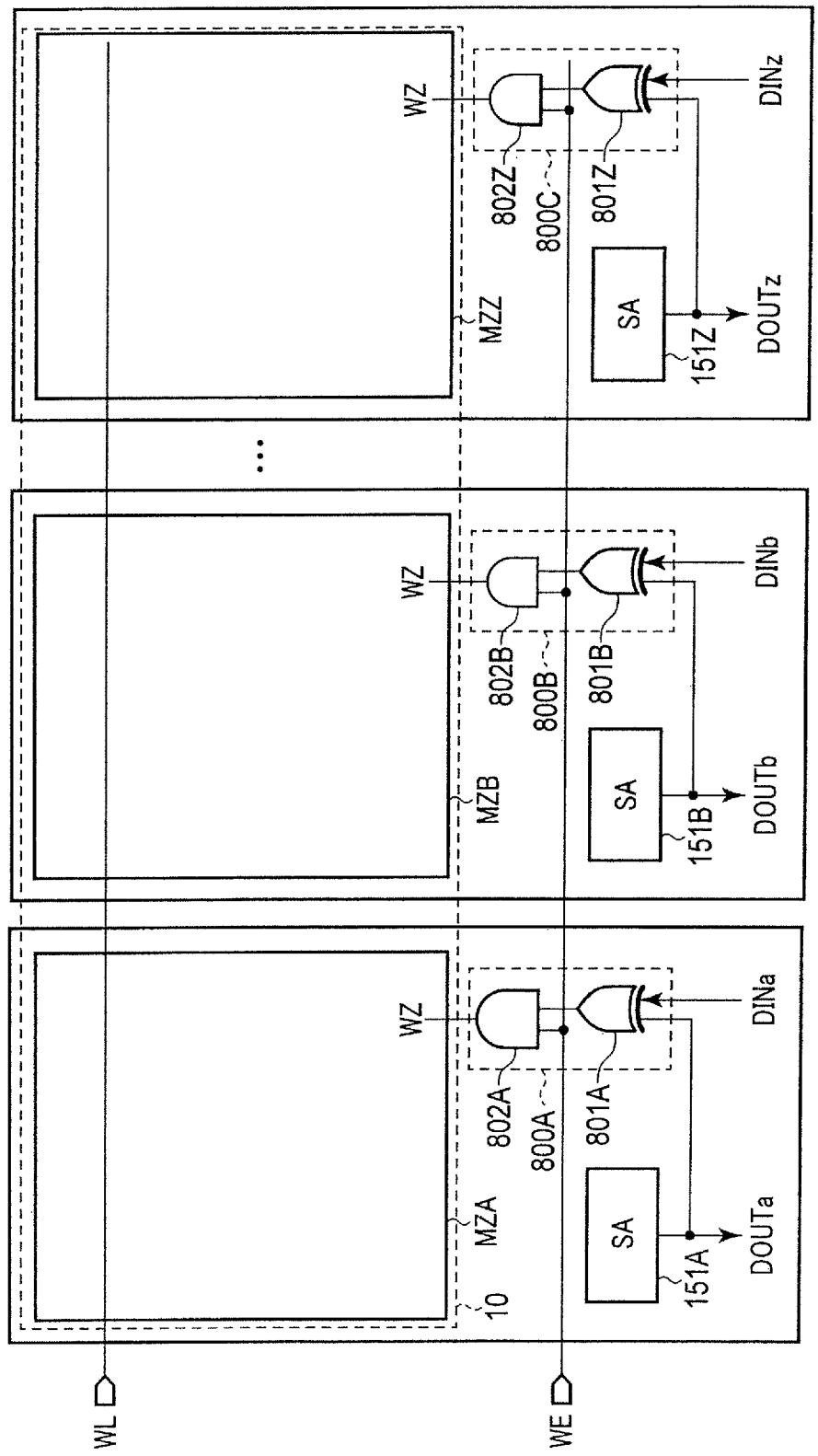
FIG. 25 is a schematic view illustrating a configuration example of the resistance change type memory of the seventh embodiment.

Referring to FIG. 24 and FIG. 25, a resistance change type memory of a seventh embodiment will be described.

FIG. 24 is an equivalent circuit diagram illustrating a circuit configuration of the resistance change type memory (e.g. MRAM) of the present embodiment.

The voltage write type MRAM induces magnetization switching of the MTJ element by a unipolar operation by the application of the write voltage VW, and thus, there is a possibility that selective write of data corresponding to data to be written cannot be executed.

To cope with this, as described above, the data in the selected cell is read by the initial read before the write (program) of data, and it is judged whether the data in the selected cell and the data to be written agree or not. Based on this judgement result, the necessity/nonnecessity of program of data to the MTJ element in the selected cell is determined.

As illustrated in FIG. 24, in the MRAM of this embodiment, a signal WZ indicative of the necessity/nonnecessity of data program based on the result of the initial read is provided as a control signal of the write circuit 16.

The signal WZ is supplied to the gate of a transistor TRZ in the equalizer circuit 165.

One end of the current path of the transistor TRZ is connected to the voltage line 900B. The other end of the current path of the transistor TRZ is connected to one end of the current path of the transistor TRB via an interconnect.

The electrical connection between the voltage line 900B and transistor TRB and the supply of the voltage are controlled by the ON/OFF control of the transistor TRZ corresponding to the signal level of the signal WZ.

When the data to be written and the read data do not agree, the signal level of the signal WZ is set at "H" level. When the transistor TRZ is set in the ON state by the signal WZ of "H" level, the voltage line 900B is electrically connected to the transistor TRB by the transistor TRZ that is in the ON state. Thereby, the write voltage VW is supplied to the selected cell MCk.

When the data to be written and the read data agree, the signal level of the signal WZ is set at "L" level. When the transistor TRZ is set in the OFF state by the signal WZ of "L" level, the voltage line 900B is electrically disconnected to the transistor TRB by the transistor TRZ that is in the OFF state. Thereby, the write voltage VW is not supplied to the selected cell MCk.

In this manner, in the MRAM of this embodiment, the transfer of the voltage having the voltage value V1 (or voltage value VA) between the voltage line 900B and bit line bBL is controlled in accordance with the signal level of the signal WZ.

FIG. 25 illustrates an applied example of the MRAM of the present embodiment.

As illustrated in FIG. 25, in the memory cell array 10, a plurality of control units MZ (MZA, MZB, . . . , MZZ) are provided. In this case, the necessity/nonnecessity of program of data is judged with respect to each of the control units MZ. For example, the structure of FIG. 24 corresponds to one control unit MZ.

The MRAM of this embodiment includes circuits (hereinafter referred to as "signal generation circuits") 800 (800A, 800B, . . . , 800Z) for generating a plurality of signals WZ.

The signal generation circuits 800 correspond to the control units MZ in a one-to-one correspondence.

The signal generation circuit 800 includes an XOR gate 801 (801A, 801B, . . . , 801Z) and an AND gate 802 (802A, 802B, . . . , 802Z).

A first input terminal of the XOR gate 801 is connected to an output terminal of the corresponding sense amplifier circuit 151 (151A, 151B, . . . , 151Z). A second input terminal of the XOR gate 801 is connected to the corresponding data input terminal.

Thereby, at the time of the write operation, the data DOUT (DOUTa, DOUTb, . . . , DOUTz) that is read from the selected cell MCk and the data DIN to be written (DINa, DINb, . . . , DINz) from the outside are supplied to the XOR gate 801. The data DINa, DINb, . . . , DINz, which is supplied to each XOR gate 801, is 1-bit data corresponding to the control unit MZ among the to-be-written data of a certain data size. In addition, the data DOUTa, DOUTb, . . . , DOUTz is 1-bit data.

The XOR gate 801 supplies a calculation result between the data DOUT and data DIN to a first input terminal of the AND gate 802.

The first input terminal of the AND gate 802 is connected to the output terminal of the XOR gate 801. A second input terminal of the AND gate 802 is connected to an interconnect (signal line) to which the write enable signal WE is supplied.

An output terminal of the AND gate 802 is connected to the gate of the transistor TRZ. The AND gate 802 outputs as the signal WZ a calculation result between the signal from the XOR gate 801 and the write enable signal WE.

As described above, when the data stored in the selected cell (the data from the sense amplifier circuit 151) agrees with the write data DIN from the outside, the XOR gate 801 outputs the signal of "L" level.

Therefore, at the time of the write operation, the AND gate 802 executes the AND operation between the signal of "L" level (the result of the XOR operation) from the XOR gate 801 and the write enable signal WE of "H" level, and thereby, program of data or mask (non-program) of data to the selected cell can be controlled.

Besides, as illustrated in FIG. 25, when the plural control units MZ, which are divided in the direction of extension of word lines WL, are provided in the memory cell array 10, the voltage line area 90 may be provided between neighboring control units MZ. One voltage line area 90 may be shared by two control units MZ.

In the present embodiment, at the time of the write operation of the MRAM, the equalizer circuit 165 and signal generation circuit 800 operate as follows.

At the time of the write operation, the write enable signal WE is set at "H" level.

When the data DIN and the data DOUT of the initial read agree, the XOR gate 801 outputs the signal of "L" level.

The signal of "L" level from the XOR gate 801 and the signal WE of "H" level are supplied to the AND gate 802.

Thereby, the AND gate 802 supplies the signal WZ of "L" level to the transistor TRZ.

Therefore, when the data DIN and data DOUT agree, the transistor TRZ is set in the OFF state by the signal WZ of "L" level. The voltage line 900B is electrically disconnected from the transistor TRB by the transistor TRZ that is in the OFF state.

As a result, in the MRAM of this embodiment, the supply of the write voltage VW is shut off, and the program of data is not executed.

On the other hand, when the data DIN and the data DOUT do not agree, the XOR gate 801 outputs the signal of "H" level.

The signal of "H" level from the XOR gate 801 and the signal WE of "H" level are supplied to the AND gate 802.

Thereby, the AND gate 802 supplies the signal WZ of "H" level to the transistor TRZ.

Therefore, when the data DIN and data DOUT do not agree, the transistor TRZ is set in the ON state by the signal WZ of "H" level. The voltage line 900B is electrically connected to the transistor TRB by the transistor TRZ that is in the ON state.

Thereby, in the MRAM of this embodiment, the voltage of the predetermined voltage value is transferred as the write voltage VW from the voltage line 900B to the bit line bBLk via the transistors TRB and TRZ that are in the ON state. As a result, in the MRAM of this embodiment, the program of data is executed.

This operation is executed in parallel for each control unit MZ at the time of the write operation, and the program of data or the mask process (non-program) of data is executed for each control unit MZ.

In the present embodiment, the circuit (transistor), which is set in the ON state or OFF state in accordance with the necessity/nonnecessity of program, is provided between the voltage line 900 and equalizer circuit 165, and thereby, the frequency of charge and discharge of the voltage line 900 can be reduced.

As described above, the resistance change type memory of this embodiment can improve the operational characteristics of the memory.

(8) Others

In each of the above embodiments, by using the MRAM by way of example, the descriptions were given of the write circuit for writing data to the memory cell, and the generation method of the write voltage for writing data to the memory cell.

Each of the above embodiments may be applied to magnetic memories other than the MRAM, if the magnetic memories use MTJ elements.

The write circuit and the generation method of the write voltage, which were described in the above embodiments, are applicable to resistance change type memories other than the magnetic memory, if the resistance change type memories are of the type in which the change of the resistance state of the variable resistance element functioning as the memory element depends on the pulse shape of the write voltage. For example, the above-described embodiments may be applied to at least one resistance change type memory selected from among a ReRAM, PCRAM, ion memory, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change type memory comprising:
    a variable resistance element connected between a first bit line and a second bit line;
    a write control circuit including
        a first transistor including a first terminal connected to the first bit line;
        a second transistor including a second terminal connected to the first bit line;
        a first element including a first output terminal outputting a first signal which controls ON and OFF of the first transistor;
        a first interconnect connected to the first output terminal; and
        a second element including a first input terminal connected to the first interconnect, and a second output terminal outputting a second signal which controls ON and OFF of the second transistor, the second signal being based on the first signal from the first interconnect,
    the write control circuit controlling write to the variable resistance element;
    a second interconnect supplied with a first voltage and connected to the first bit line via the first transistor; and
    a third interconnect supplied with a second voltage which is higher than the first voltage, and connected to the first bit line via the second transistor,
    wherein the write control circuit:
    supplies the first voltage to the first bit line via the first transistor which is in an ON state;
    sets the second transistor in an ON state after supplying the first voltage; and
    supplies the second voltage to the first bit line with a first pulse width via the second transistor which is in the ON state.

2. The resistance change type memory of claim 1, further comprising:
    a driver circuit applying to the second bit line a third voltage which is higher than the first voltage and is lower than the second voltage.

3. The resistance change type memory of claim 1, wherein the variable resistance element is a magnetoresistive effect element.

4. The resistance change type memory of claim 3, wherein the first bit line is electrically connected to a reference layer of the magnetoresistive effect element, and
    the second bit line is electrically connected to a storage layer of the magnetoresistive effect element.

5. The resistance change type memory of claim 1, further comprising:
    a time adjusting circuit connected to the first interconnect.

6. The resistance change type memory of claim 1, further comprising:
    a judgment circuit reading data from the variable resistance element at least one of (i) before supply of a write voltage to the variable resistance element or (ii) after the supply of the write voltage to the variable resistance element, and judging whether the data that is read agrees with data that is to be written to the variable resistance element, wherein the judgment circuit:

controls the write control circuit not to supply the write voltage to the variable resistance element, when the data that is read agrees with the data that is to be written, and controls the write control circuit to supply the write voltage to the variable resistance element, when the data that is read does not agree with the data that is to be written.

7. The resistance change type memory of claim 1, further comprising:

a third transistor included in the write control circuit and connected to the first bit line; and a fourth interconnect supplied with the first voltage and connected to the first bit line via the third transistor, wherein the write control circuit is configured to:

set the third transistor in an ON state after supplying the second voltage to the first bit line via the second transistor that is in the ON state; and supply the first voltage to the first bit line via the third transistor that is in an ON state.

8. The resistance change type memory of claim 1, further comprising:

a third transistor included in the write control circuit and connected between the first bit line and the second interconnect, wherein the write control circuit:

supplies the second voltage to the first bit line via the second transistor that is in the ON state;

sets the third transistor in an ON state after supplying the second voltage; and supplies the first voltage to the first bit line via the third transistor that is in the ON state.

9. The resistance change type memory of claim 1, wherein the write control circuit further includes a third transistor connected between the first bit line and the second bit line, and the third transistor electrically connects the first bit line and the second bit line after supplying the second voltage.

10. A resistance change type memory comprising:

a variable resistance element connected between a first bit line and a second bit line;

a write control circuit including a first transistor including a first terminal connected to the first bit line, second transistor including a second terminal connected to the first bit line, a first element including a first output terminal outputting a first signal which controls ON and OFF of the first transistor, a first interconnect connected to the first output terminal, and a second element including a first input terminal connected to the first interconnect and a second output terminal outputting a second signal which controls ON and OFF of the second transistor based on the first signal from the first interconnect, the write control circuit controlling write to the variable resistance element;

a second interconnect connected to the first bit line via the first transistor; and a third interconnect connected to the first bit line via the second transistor.

11. The resistance change type memory of claim 10, further comprising:

a third transistor included in the write control circuit and including a third terminal connected to the first bit line; and a fourth interconnect connected to the first bit line via the third transistor.

12. The resistance change type memory of claim 10, further comprising:

a third transistor included in the write control circuit and connected between the first bit line and the second interconnect.

13. The resistance change type memory of claim 10, further comprising:

a third transistor included in the write control circuit and connected between the first bit line and the second bit line.

14. A resistance change type memory comprising:

a variable resistance element connected between a first bit line and a second bit line;

a write control circuit including a first transistor including a first terminal connected to the first bit line;

a second transistor including a second terminal connected to the first bit line;

a first element including a first output terminal outputting a first signal which controls ON and OFF of the first transistor;

a first interconnect connected to the first output terminal; and a second element including a first input terminal connected to the first interconnect, and a second output terminal outputting a second signal which controls ON and OFF of the second transistor, the second signal being based on the first signal from the first interconnect, the write control circuit controlling write to the variable resistance element;

a second interconnect supplied with a first voltage and connected to the first bit line via the first transistor; and a third interconnect supplied with a second voltage higher than the first voltage, and connected to the first bit line via the second transistor, wherein the write control circuit:

supplies the second voltage to the first bit line with a first pulse width via the second transistor which is in an ON state;

sets the first transistor in an ON state after supplying the second voltage; and supplies the first voltage to the first bit line via the first transistor which is in the ON state.

15. The resistance change type memory of claim 14, further comprising:

a third transistor included in the write control circuit and including a third terminal connected to the first bit line; and a fourth interconnect supplied with the first voltage and connected to the first bit line via the third transistor.

16. The resistance change type memory of claim 15, wherein the write control circuit supplies the first voltage to the first bit line via the third transistor which is in an ON state, before supplying the second voltage.

17. The resistance change type memory of claim 14, wherein a third voltage is supplied to the second bit line, and the third voltage is higher than the first voltage and is lower than the second voltage.

18. The resistance change type memory of claim 14, wherein the variable resistance element is a magnetoresistive effect element.

\* \* \* \* \*